(12) United States Patent
Odnoblyudov et al.

(10) Patent No.: US 12,315,721 B2
(45) Date of Patent: *May 27, 2025

(54) POLYCRYSTALLINE CERAMIC SUBSTRATE

(71) Applicant: QROMIS, Inc., Santa Clara, CA (US)

(72) Inventors: Vladimir Odnoblyudov, Danville, CA (US); Cem Basceri, Los Gatos, CA (US); Shari Farrens, Boise, ID (US)

(73) Assignee: QROMIS, Inc., Santa Clara, CA (US)

( * ) Notice: Subject to any disclaimer, the term of this patent is extended or adjusted under 35 U.S.C. 154(b) by 673 days.

This patent is subject to a terminal disclaimer.

(21) Appl. No.: 17/185,223

(22) Filed: Feb. 25, 2021

(65) Prior Publication Data
US 2021/0183642 A1    Jun. 17, 2021

Related U.S. Application Data

(63) Continuation of application No. 16/773,415, filed on Jan. 27, 2020, now Pat. No. 10,964,535, which is a
(Continued)

(51) Int. Cl.
*H01L 21/02* (2006.01)
*C23C 16/40* (2006.01)
(Continued)

(52) U.S. Cl.
CPC ........ *H01L 21/0242* (2013.01); *C23C 16/401* (2013.01); *C23C 16/50* (2013.01);
(Continued)

(58) Field of Classification Search
None
See application file for complete search history.

(56) References Cited

U.S. PATENT DOCUMENTS 5,472,370 A    12/1995  Malshe
5,772,780 A     6/1998  Homma et al.
(Continued)

FOREIGN PATENT DOCUMENTS

CN    101248515 A    8/2008
EP       203 495 A1   8/2017
(Continued)

OTHER PUBLICATIONS

Taiwan Office Action dated Mar. 29, 2023 in related Taiwanese Application No. 112103239 (two pages).
(Continued)

*Primary Examiner* — David Sample
(74) *Attorney, Agent, or Firm* — Kilpatrick Townsend & Stockton LLP

(57) ABSTRACT

An engineered substrate structure includes a ceramic substrate having a front surface characterized by a plurality of voids, and a barrier layer encapsulating the ceramic substrate. The barrier layer defining a plurality of valleys corresponding to the plurality of voids. The engineered substrate structure further includes a first bonding layer comprising a bonding layer material and coupled to the barrier layer on the front surface of the ceramic substrate. The first bonding layer defines a plurality of fill regions filled with the bonding layer material in the plurality of valleys corresponding to the plurality of voids. The engineered substrate structure further includes a second bonding layer coupled to the first bonding layer, and a substantially single crystalline layer joined to the second bonding layer.

20 Claims, 17 Drawing Sheets

Related U.S. Application Data continuation of application No. 16/161,853, filed on Oct. 16, 2018, now Pat. No. 10,566,190, which is a continuation of application No. 15/621,235, filed on Jun. 13, 2017, now Pat. No. 10,134,589.

(60) Provisional application No. 62/354,623, filed on Jun. 24, 2016.

(51) Int. Cl.

| | | |
|---|---|---|
| *C23C 16/50* | (2006.01) | |
| *C23C 16/56* | (2006.01) | |
| *C30B 29/06* | (2006.01) | |
| *C30B 29/40* | (2006.01) | |
| *H01L 21/84* | (2006.01) | |
| *H01L 27/12* | (2006.01) | |
| *H01L 33/00* | (2010.01) | |
| *H01L 33/02* | (2010.01) | |
| *H10D 86/00* | (2025.01) | |
| *H10D 86/01* | (2025.01) | |
| *H10H 20/01* | (2025.01) | |
| *H10H 20/81* | (2025.01) | |

(52) U.S. Cl.
CPC .............. *C23C 16/56* (2013.01); *C30B 29/06* (2013.01); *C30B 29/406* (2013.01); *H01L 21/0243* (2013.01); *H01L 21/0245* (2013.01); *H01L 21/02516* (2013.01); *H01L 21/02532* (2013.01); *H01L 21/0254* (2013.01); *H10D 86/00* (2025.01); *H10D 86/01* (2025.01); *H10H 20/0137* (2025.01); *H10H 20/81* (2025.01); *C30B 29/403* (2013.01)

(56) References Cited

U.S. PATENT DOCUMENTS

| | | | |
|---|---|---|---|
| 5,854,499 | A | 12/1998 | Nishioka |
| 6,077,784 | A | 6/2000 | Wu et al. |
| 6,143,597 | A | 11/2000 | Matsuda et al. |
| 6,649,957 | B2 | 11/2003 | Hsu et al. |
| 7,422,958 | B2 | 9/2008 | Kostrzewa et al. |
| 7,452,813 | B2 | 11/2008 | Tsukamoto |
| 8,101,498 | B2 | 1/2012 | Pinnington et al. |
| 8,592,908 | B2 | 11/2013 | Yamazaki et al. |
| 8,709,901 | B1 | 4/2014 | Chang et al. |
| 8,927,346 | B2 | 1/2015 | Kamins |
| 8,987,728 | B2 | 3/2015 | Honda et al. |
| 9,082,692 | B2 | 7/2015 | Odnoblyudov et al. |
| 9,218,954 | B2 | 12/2015 | Singh et al. |
| 10,134,589 | B2 | 11/2018 | Odnoblyudov et al. |
| 10,566,190 | B2 | 2/2020 | Odnoblyudov et al. |
| 10,566,223 | B2 | 2/2020 | Lawson et al. |
| 10,964,535 | B2 | 3/2021 | Odnoblyudov et al. |
| 2003/0013211 | A1 | 1/2003 | Hu et al. |
| 2004/0178448 | A1 | 9/2004 | Rayssac et al. |
| 2006/0199389 | A1 | 9/2006 | Tsukamoto |
| 2007/0269604 | A1 | 11/2007 | Francis et al. |
| 2010/0044718 | A1 | 2/2010 | Hanser et al. |
| 2012/0228613 | A1 | 9/2012 | Seki et al. |
| 2012/0266810 | A1 | 10/2012 | Lan et al. |
| 2014/0183442 | A1 | 7/2014 | Odnoblyudov et al. |
| 2014/0197419 | A1 | 7/2014 | Henley et al. |
| 2015/0270288 | A1 | 9/2015 | Yamazaki et al. |
| 2015/0295047 | A1 | 10/2015 | Huang et al. |
| 2016/0087167 | A1 | 3/2016 | Kundaliya et al. |
| 2016/0380155 | A1 | 12/2016 | Jeong |
| 2017/0221786 | A1 | 8/2017 | Konishi et al. |
| 2018/0047557 | A1 | 2/2018 | Odnoblyudov et al. |
| 2019/0115208 | A1 | 4/2019 | Odnoblyudov et al. |
| 2020/0234945 | A1 | 7/2020 | Odnoblyudov et al. |
| 2022/0059341 | A1 | 2/2022 | Odnoblyudov et al. |

FOREIGN PATENT DOCUMENTS

| | | | | |
|---|---|---|---|---|
| EP | 3 475 975 | A1 | 5/2019 | |
| JP | 2001-194490 | A | 4/1989 | |
| JP | 2004-042883 | A | 2/1992 | |
| JP | 8-26841 | A | 1/1996 | |
| JP | 1996-826841 | A | 1/1996 | |
| JP | 2013-535090 | A | 1/1996 | |
| JP | H08-88153 | A | 4/1996 | |
| JP | 2001-097787 | A | 4/2001 | |
| JP | 2005-203596 | A | 7/2005 | |
| JP | 2006-517734 | A | 7/2006 | |
| JP | 2006-245385 | A | 9/2006 | |
| JP | 2008-153696 | A | 7/2008 | |
| JP | 2008-263010 | A | 10/2008 | |
| JP | 2008-538658 | A | 10/2008 | |
| JP | 2009-010351 | A | 1/2009 | |
| JP | 2010-502023 | A | 1/2010 | |
| JP | 2011-165958 | A | 8/2011 | |
| JP | 2012-197213 | A | 10/2012 | |
| JP | 2015-195365 | A | 11/2015 | |
| JP | 2016-072450 | A | 5/2016 | |
| KR | 20050106006 | A | * 11/2005 | ....... H01L 21/76251 |
| KR | 2008-0107256 | A | 12/2008 | |
| TW | 201810543 | | 3/2018 | |
| WO | 2015/095803 | A1 | 6/2015 | |
| WO | 2017/222873 | A1 | 12/2017 | |

OTHER PUBLICATIONS

Decision to Grant dated Jun. 26, 2023 in related Korean Application No. 10-2022-7013772 (four pages).
Notice of Decision to Grant dated May 17, 2023 in related Chinese Application No. 201780038465.8 (four pages).
Chinese Office Action dated Oct. 8, 2022 in related Chinese Office Action No. 201780038465.8 (eleven pages).
Taiwan Office Action dated Jun. 13, 2022 in related Taiwan Patent Application No. 111118186 (two pages).
Singapore Decision to Grant dated Sep. 8, 2022 in related Singapore Application No. 11201811295T (four pages).
Japanese Notice of Allowance dated Sep. 30, 2022 related Japanese Application No. 2020-103432 (three pages).
Taiwan Decision to Grant dated Oct. 31, 2022 in related Taiwan Patent Application No. 111118186 (four pages).
Korean Office Action dated Dec. 19, 2022 in related Korean Patent Application No. 10-2022-7013772 (seven pages).
Notice of Decision to Grant dated Jul. 31, 2023 in related Taiwanese Application No. 112103239 (six pages).
PCT/US2017/037213, "International Search Report and Written Opinion," Aug. 15, 2017 (12 pages).
Extended European Search Report in related European Patent Application No. 17815942.2 dated Feb. 6, 2020; (14 pages).
Notice of Allowance in related Japanese Patent Application No. 2018- 567717 dated May 22, 2020; (three pages).
Notice of Allowance dated Jan. 26, 2022 in related Korean Application No. 10-2019-7002180, filed Jun. 13, 2017 (five pages).
Second Office Action dated Feb. 10, 2022 in related Japanese Application No. 2020-103432, filed Jun. 13, 2017 (14 pages).
Copy of Extended European Search Report dated Mar. 21, 2022 in related European Patent Application No. 21212748.4, filed Jun. 13, 2017 (13 pages).
First Office Action dated Jul. 2, 2021 in related Japanese Patent Application No. 2020-103432, filed Jun. 13, 2017 (ten pages).
First Office Action dated Jul. 28, 2021 in related Korean Patent Application No. 10-2019-7002180, filed Jun. 13, 2017 (eight pages).
Notice of Reasons for Rejection in related Japanese Application No. 2022-173496 dated Dec. 27, 2023 (nine pages).
Non-Final Office Action dated Dec. 27, 2023 in related U.S. Appl. No. 17/518,894, filed Nov. 4, 2021 (twelve pages).
Taiwan Office Action dated Dec. 29, 2023 in related Taiwanese Application No. TW112140126 (two pages).
Final Office Action dated Apr. 4, 2024 in related U.S. Appl. No. 17/518,894 (ten pages).

(56) References Cited

OTHER PUBLICATIONS

Notice of Decision to Grant dated Mar. 29, 2024 in related Taiwan Application No. 112140126 (six pages).
Japanese Office Action dated Apr. 12, 2024 in related Japanese application No. JP2022-173496 (seven pages).
Notice of Allowance dated Nov. 22, 2024 in related Japanese application No. 2022-173496; three pages.
Advisory Action dated Aug. 22, 2024 in related U.S. Appl. No. 17/518,894; four pages.
Notice of Decision to Grant dated Sep. 22, 2024 in related Korean Applicaton No. 10-2023-7032172; three pages.
Notice of Allowance dated Sep. 27, 2024 in related U.S. Appl. No. 17/518,894; five pages.

* cited by examiner

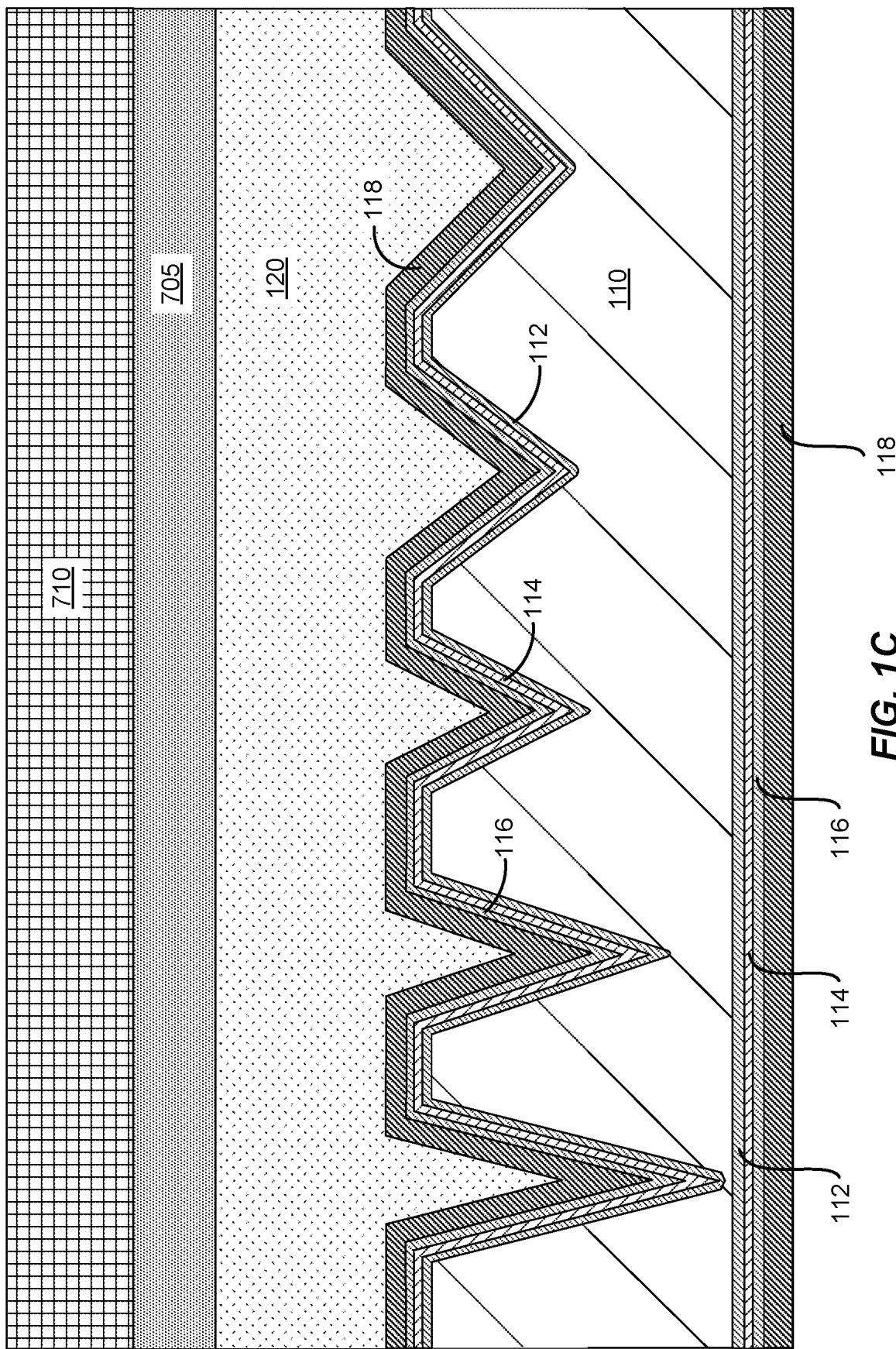

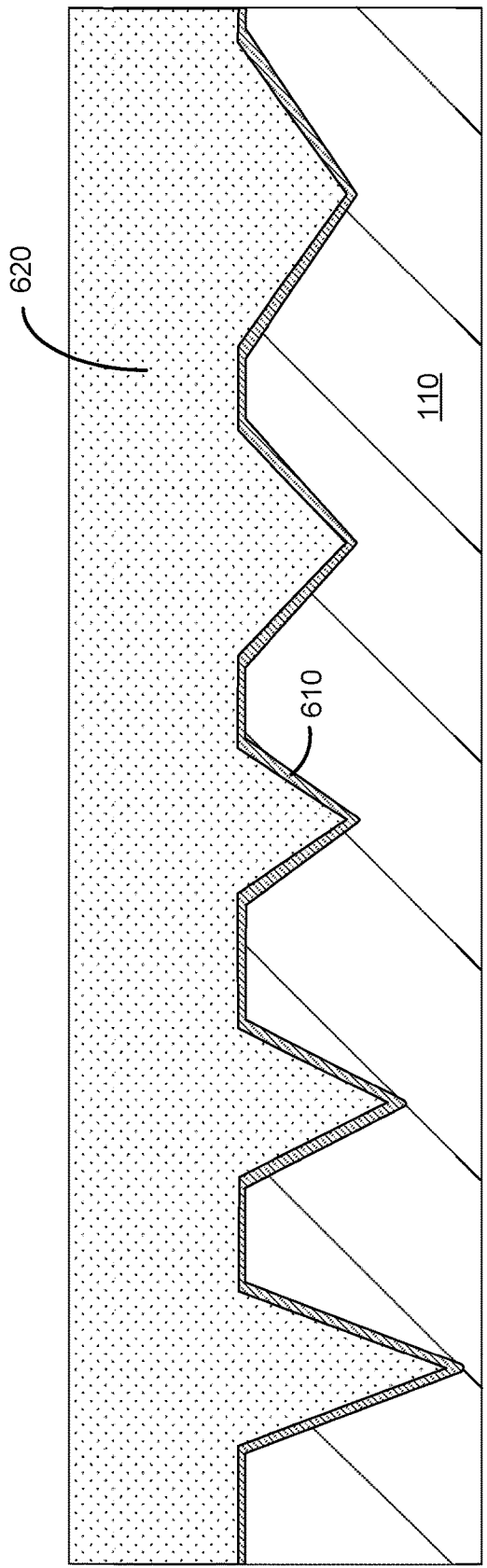
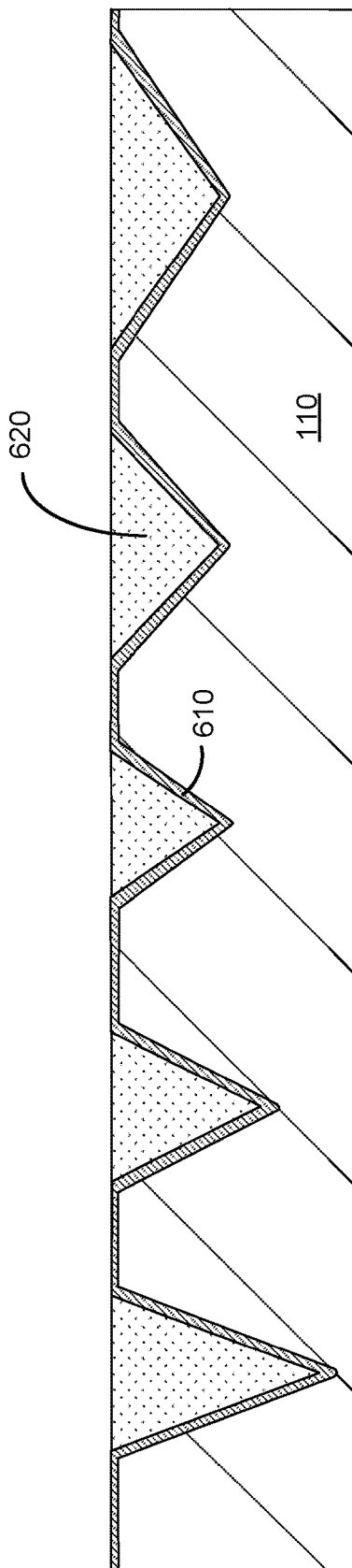
FIG. 6A
FIG. 6B

POLYCRYSTALLINE CERAMIC SUBSTRATE

CROSS-REFERENCES TO RELATED APPLICATIONS

This application is a continuation application of U.S. patent application Ser. No. 16/773,415, filed on Jan. 27, 2020, which is a continuation of U.S. patent application Ser. No. 16/161,853, filed on Oct. 16, 2018, now U.S. Pat. No. 10,566,190, which is a continuation application of U.S. patent application Ser. No. 15/621,235, filed on Jun. 13, 2017, now U.S. Pat. No. 10,134,589, which claims priority to U.S. Provisional Patent Application No. 62/354,623, filed on Jun. 24, 2016, entitled "POLYCRYSTALLINE CERAMIC SUBSTRATE AND METHOD OF MANUFACTURE," the disclosures of which are hereby incorporated by reference in their entireties for all purposes.

BACKGROUND OF THE INVENTION

Light-emitting diode (LED) structures are typically epitaxially grown on sapphire substrates. Many products currently use LED devices, including lighting, computer monitors, and other display devices.

The growth of gallium nitride based LED structures on a sapphire substrate is a heteroepitaxial growth process since the substrate and the epitaxial layers are composed of different materials. Due to the heteroepitaxial growth process, the epitaxially grown material can exhibit a variety of adverse effects, including reduced uniformity and reductions in metrics associated with the electronic/optical properties of the epitaxial layers. Accordingly, there is a need in the art for improved methods and systems related to epitaxial growth processes and substrate structures.

SUMMARY OF THE INVENTION

The present invention relates generally to engineered substrate structures. More specifically, the present invention relates to methods and systems suitable for use in epitaxial growth processes. Merely by way of example, the invention has been applied to a method and system for providing a substrate structure suitable for epitaxial growth that is characterized by a coefficient of thermal expansion (CTE) that is substantially matched to epitaxial layers grown thereon. The methods and techniques can be applied to a variety of semiconductor processing operations.

According to an embodiment, a method of fabricating a ceramic substrate structure includes providing a ceramic substrate, encapsulating the ceramic substrate in a barrier layer, and forming a bonding layer coupled to the barrier layer. The method further includes removing a portion of the bonding layer to expose at least a portion of the barrier layer and define fill regions, and depositing a second bonding layer on the at least a portion of the exposed barrier layer and the fill regions. In other embodiments, the barrier layer is not exposed during the removal process.

According to another embodiment, a method of fabricating a ceramic substrate structure includes providing a ceramic substrate, forming a bonding layer coupled to a front surface of the ceramic substrate, performing a chemical-mechanical polishing (CMP) process to remove a portion of the bonding layer and to expose at least a portion of the front surface of the ceramic substrate, and encapsulating the ceramic substrate in a barrier layer. In some embodiments, the barrier layer can include silicon nitride. The front surface of the ceramic substrate can be characterized by an RMS roughness in the range of 50-600 nm and the barrier layer can be characterized by an RMS roughness in the range of 0.5-2 nm. The front surface of the ceramic substrate can be characterized by a plurality of voids and the bonding layer can fill the plurality of voids.

Numerous benefits are achieved by way of the present invention over conventional techniques. For example, embodiments of the present invention provide substrate structure suitable for epitaxial growth that is characterized by a coefficient of thermal expansion (CTE) that is substantially matched to epitaxial layers grown thereon. Matching the thermal expansion properties of the growth substrate to the epitaxial layer reduces the stress in the epitaxial layers and/or the engineered substrate. Stress is responsible for several types of defects. For example, stress may increase dislocation density in the epitaxial layer, which impairs electrical and optical properties of the epitaxial layer. Stress may also lead to residual strain in the epitaxial layer or the substrate, which may lead to additional processing concern in later steps, such as stress cracking, dislocation glide, slip, bow and warp. Thermal expansion induced bow and warp of the substrate may make handling of the material problematic in automated equipment, and limit the ability to perform additional lithographic steps necessary for device fabrication, substrate cracking, and materials creep. In addition, the device performance lifetime is reduced in stressed materials. Stress relaxation and stress-induced crack propagation, dislocation glide, and other lattice movement resulting from thermal mismatch may lead to early failures in a range of modes, from reduced device performance to fracture or peeling of devices and device layers. The devices are manufactured in the epitaxial layers.

These and other embodiments of the invention along with many of its advantages and features are described in more detail in conjunction with the text below and attached figures.

BRIEF DESCRIPTION OF THE DRAWINGS

FIG. 1C is a simplified schematic diagram illustrating an engineered substrate structure including an epitaxial layer according to an embodiment of the present invention.

FIG. 6A is a simplified schematic diagram illustrating a polycrystalline ceramic core and a planarization material according to an embodiment of the present invention.

FIG. 6B is a simplified schematic diagram illustrating a polycrystalline ceramic core and a planarization material after a CMP process according to an embodiment of the present invention.

DETAILED DESCRIPTION OF SPECIFIC EMBODIMENTS

Embodiments of the present invention relate to engineered substrate structures. More specifically, the present invention relates to methods and systems suitable for use in epitaxial growth processes. Merely by way of example, the invention has been applied to a method and system for providing a substrate structure suitable for epitaxial growth that is characterized by a coefficient of thermal expansion (CTE) that is substantially matched to epitaxial layers grown thereon. The methods and techniques can be applied to a variety of semiconductor processing operations.

Figure 1A:
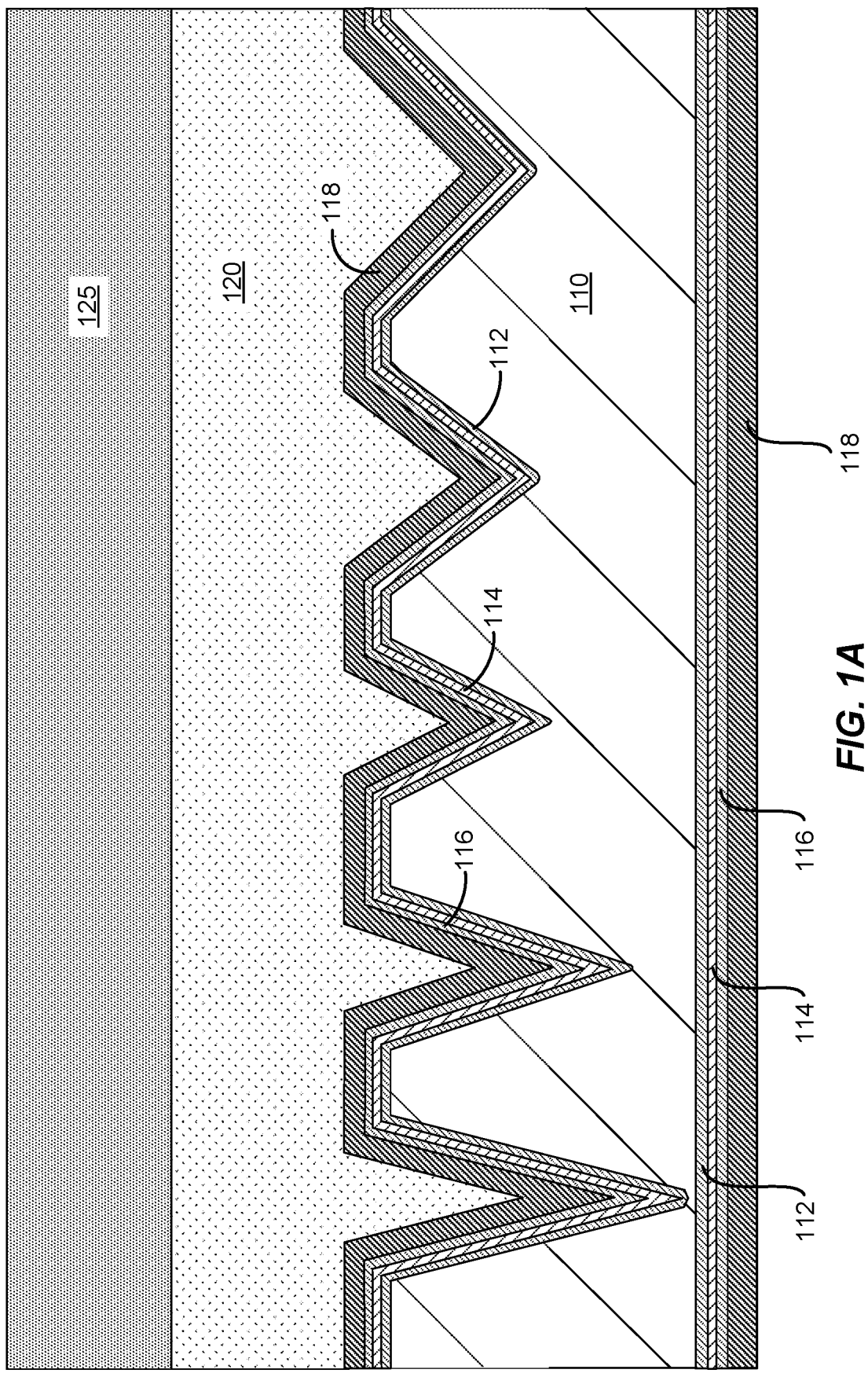
FIG. 1A is a simplified schematic diagram illustrating an engineered substrate structure according to an embodiment of the present invention.

FIG. 1A is a simplified schematic diagram illustrating an engineered substrate structure according to an embodiment of the present invention. As illustrated in FIG. 1A, the engineered substrate structure illustrated in FIG. 1A is suitable for a variety of electronic and optical applications. The engineered substrate structure includes a core 110 (e.g., AlN Substrate) that can have a coefficient of thermal expansion (CTE) that is substantially matched to the CTE of the epitaxial material that will be grown on the engineered substrate structure, for example, on an exfoliated silicon (111) layer. As discussed more fully herein, the epitaxial material can include other elemental semiconductor material including silicon layers with different crystal orientations other than (111) silicon and/or compound semiconductor materials including gallium nitride (GaN)-based materials. These variations include crystalline growth faces, and the like. One of ordinary skill in the art would recognize many variations, modifications, and alternatives.

For applications including the growth of gallium nitride (GaN)-based materials (epitaxial layers including GaN-based layers), the core 110 can be a polycrystalline ceramic material, for example, polycrystalline aluminum nitride (AlN), which can include a binding material such as yttrium oxide. Other materials can be utilized in the core, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core can be on the order of 100 to 1,500 μm, for example, 725 μm. The core is encapsulated in an adhesion layer 112 (labeled as TEOS) that can be referred to as a shell or an encapsulating shell. FIG. 1A, which only illustrates a central portion of the engineered substrate structure and does not illustrate the edges, illustrates this encapsulation by showing the presence of the adhesion layer 112 above and below core 110 and it will be understood that the adhesion layer 112 will also be present on the edges of the core 110, which are not shown for purposes of clarity. Similarly for the conductive layer 114, second adhesion layer 116, and barrier layer 118, discussed more fully below, the presence of these encapsulating layers is illustrated above and below the core, but it will be understood that these layers will be present on the edges as well. One of ordinary skill in the art would recognize many variations, modifications, and alternatives.

In an embodiment, the adhesion layer 112 comprises a tetraethyl orthosilicate (TEOS) oxide layer on the order of 1,000 Å in thickness. In other embodiments, the thickness of the adhesion layer varies, for example, from 100 Å to 2,000 Å. Although TEOS oxides are utilized for adhesion layers in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. The adhesion layer 112 completely surrounds the core 110 in some embodiments to form a fully encapsulated core and can be formed using an LPCVD process or other suitable deposition processes, which can be compatible with semiconductor processing and in particular with polycrystalline or composite substrates and layers. The adhesion layer provides a surface on which subsequent layers adhere to form elements of the engineered substrate structure.

In addition to the use of LPCVD processes, spin on glass/dielectrics, furnace-based processes, and the like to form the encapsulating adhesion layer, other semiconductor processes can be utilized according to embodiments of the present invention, including CVD processes or similar deposition processes. As an example, a deposition process that coats a portion of the core can be utilized, the core can be flipped over, and the deposition process could be repeated to coat additional portions of the core. Thus, although LPCVD techniques are utilized in some embodiments to provide a fully encapsulated structure, other film formation techniques can be utilized depending on the particular application.

A conductive layer 114 is formed surrounding the adhesion layer 112. In an embodiment, the conductive layer is a shell of polysilicon (i.e., polycrystalline silicon) that is formed surrounding the adhesion layer since polysilicon can exhibit poor adhesion to ceramic materials. In embodiments in which the conductive layer is polysilicon, the thickness of the polysilicon layer can be on the order of 500-5,000 Å, for example, 2,500 Å. In some embodiments, the polysilicon layer can be formed as a shell to completely surround the adhesion layer (e.g., a TEOS oxide layer), thereby forming a fully encapsulated adhesion layer, and can be formed using an LPCVD process. In other embodiments, as discussed below, the conductive material can be formed on a portion of the adhesion layer, for example, a lower half of the substrate structure. In some embodiments, conductive material can be formed as a fully encapsulating layer and subsequently removed on one side of the substrate structure.

In an embodiment, the conductive layer 114 can be a polysilicon layer doped to provide a highly conductive material, for example, doped with boron to provide a p-type polysilicon layer. In some embodiments, the doping with boron is at a level of $1 \times 10^{19}$ cm$^{-3}$ to $1 \times 10^{20}$ cm$^{-3}$ to provide for high conductivity. Other dopants at different dopant concentrations (e.g., phosphorus, arsenic, bismuth, or the like at dopant concentrations ranging from $1 \times 10^{16}$ cm$^{-3}$ to $5 \times 10^{18}$ cm$^{-3}$) can be utilized to provide either n-type or p-type semiconductor materials suitable for use in the conductive layer. One of ordinary skill in the art would recognize many variations, modifications, and alternatives.

The presence of the conductive layer 114 is useful during electrostatic chucking of the engineered substrate to semiconductor processing tools, for example tools with electrostatic chucks (ESC or e-chuck). The conductive layer enables rapid dechucking after processing in the semiconductor processing tools. In embodiments of the present invention, the conductive layer enables electrical contact with the chuck or capacitive coupling to the electrostatic chuck (ESC or e-chuck) during future processing including bonding. Thus, embodiments of the present invention provide substrate structures that can be processed in manners utilized with conventional silicon wafers. One of ordinary skill in the art would recognize many variations, modifications, and alternatives. Additionally, having a substrate structure with high thermal conductivity in combination with the ESD chucking may afford better deposition conditions for the subsequent formation of engineered layers and epitaxial layers, as well as for the subsequent device fabrication steps. For example, it may provide desirable thermal profiles that can result in lower stress, more uniform deposition thicknesses, and better stoichiometry control through the subsequent layer formations.

A second adhesion layer 116 (e.g., a TEOS oxide layer on the order of 1,000 Å in thickness) is formed surrounding the conductive layer 114. The second adhesion layer 116 completely surrounds the conductive layer in some embodiments to form a fully encapsulated structure and can be formed using an LPCVD process, a CVD process, or any other suitable deposition process, including the deposition of a spin-on dielectric.

A barrier layer 118, for example, a silicon nitride layer, is formed surrounding the second adhesion layer 116. In an embodiment, the barrier layer 118 is a silicon nitride layer that is on the order of 2,000 Å to 5,000 Å in thickness. The barrier layer completely surrounds the second adhesion layer 116 in some embodiments to form a fully encapsulated structure and can be formed using an LPCVD process. In addition to silicon nitride layers, amorphous materials including SiCN, SiON, AlN, SiC, and the like can be utilized as barrier layers. In some implementations, the barrier layer consists of a number of sub-layers that are built up to form the barrier layer. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 118, e.g., a silicon nitride layer, prevents diffusion and/or outgassing of elements present in the core 110, for example, yttrium (elemental), yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments, can be utilized in semiconductor process flows and clean room environments.

Typically, ceramic materials utilized to form the core are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate can occur. Thus, embodiments of the present invention integrate the barrier layer into the engineered substrate structure to prevent this undesirable diffusion.

Referring once again to FIG. 1A, a bonding layer 120 (e.g., a silicon oxide layer) is deposited on a portion of the barrier layer 118, for example, the top surface of the barrier layer, and subsequently used during the bonding of a substantially single crystal layer 125 (e.g., a single crystal silicon layer such as an exfoliated silicon (111) layer). The bonding layer 120 can be approximately 1.5 µm in thickness in some embodiments. In some embodiments, the thickness of the bonding layer is 20 nm or more for bond-induced void mitigation. In some embodiments, the thickness of the bonding layer is in the range of 0.75-1.5 µm.

The substantially single crystal layer 125 (e.g., exfoliated Si (111)) is suitable for use as a growth layer during an epitaxial growth process for the formation of epitaxial materials. In some embodiments, the epitaxial material can include a GaN layer 2 µm to 10 µm in thickness, which can be utilized as one of a plurality of layers utilized in optoelectronic, RF, and power devices. In an embodiment, the substantially single crystal layer includes a single crystal silicon layer that is attached to the bonding layer using a layer transfer process.

Figure 1B:
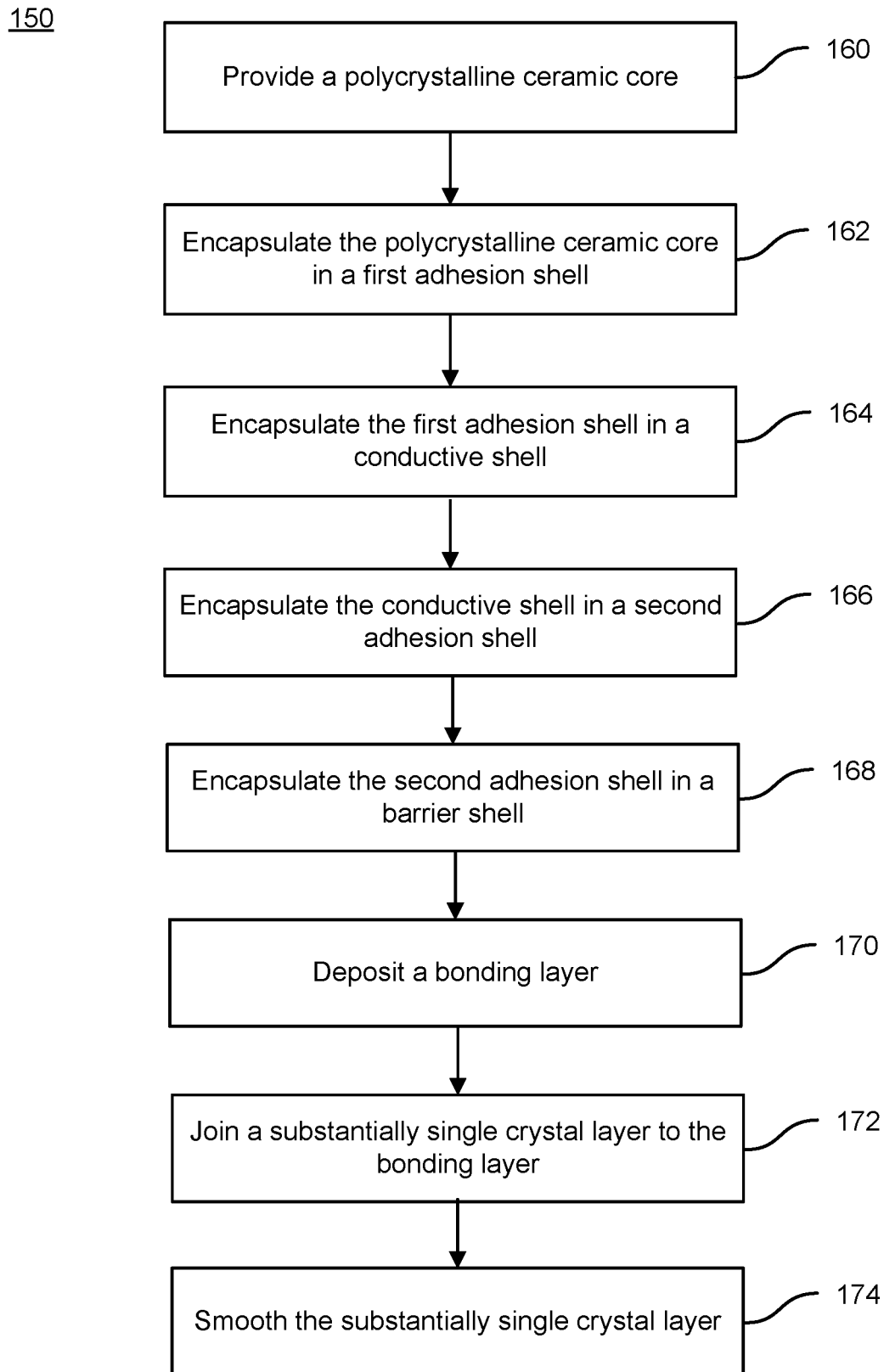
FIG. 1B is a simplified flowchart illustrating a method of fabricating an engineered substrate according to an embodiment of the present invention.

FIG. 1B is a simplified flowchart illustrating a method of fabricating an engineered substrate according to an embodiment of the present invention. The method can be utilized to manufacture a substrate that is CTE matched to one or more of the epitaxial layers grown on the substrate. The method 150 includes forming a support structure by providing a polycrystalline ceramic core (160), which can be an aluminum nitride (AlN) substrate that has been cleaned and inspected. Other polycrystalline ceramic cores can be utilized as discussed above.

The method also includes encapsulating the polycrystalline ceramic core in a first adhesion layer forming a shell (162) (e.g., a tetraethyl orthosilicate (TEOS) oxide shell approximately 80 nm in thickness), and encapsulating the first adhesion layer in a conductive shell (164) (e.g., a polysilicon shell approximately 300 nm in thickness). The first adhesion layer can be formed as a single layer of TEOS oxide. The conductive shell can be formed as a single layer of polysilicon.

The method also includes encapsulating the conductive shell in a second adhesion layer (166) (e.g., a second TEOS oxide shell approximately 80 nm in thickness) and encapsulating the second adhesion layer in a barrier layer shell (168). The second adhesion layer can be formed as a single layer of TEOS oxide. The barrier layer shell can be formed as a single layer of silicon nitride, for example, approximately 400 nm in thickness. Additional description related to the engineered substrate structure is provided in U.S. Provisional Patent Application No. 62/350,084, filed on Jun. 14, 2016, the disclosure of which is hereby incorporated by reference in its entirety for all purposes. As described herein, embodiments of the present invention can utilize a variety of materials for the adhesion layers and the diffusion barriers, including a variety of dielectrics such as $Si_xO_y$, $Si_xN_y$, $Si_xO_yN_z$, diamond like carbon (DLC), combinations thereof, and the like. Other materials, such as Ti, TiW, Ta, and TiN encapsulated in dielectrics, may also be used. One of ordinary skill in the art would recognize many variations, modifications, and alternatives.

Once the support structure including the core, the adhesion layers, the conductive layer, and the diffusion barrier, is formed by processes 160-168, the method further includes depositing a bonding layer (e.g., a PECVD silicon oxide layer) on the support structure (170) and joining a substantially single crystal layer, for example, a single crystal silicon layer, to the bonding layer (172). Other substantially single crystal layers can be used according to embodiments of the present invention, including SiC, sapphire, GaN, AlN, SiGe, Ge, Diamond, $Ga_2O_3$, ZnO, and the like. The deposition of the bonding layer can include deposition of a bonding material followed by planarization processes as described herein. In an embodiment as described below, joining the substantially single crystal layer (e.g., a single crystal silicon layer) to the bonding layer utilizes a layer transfer process in which the layer is a single crystal silicon layer that is transferred from a silicon wafer.

Referring to FIG. 1A, the bonding layer 120 can be formed by a deposition (e.g., PECVD) of a thick (e.g., 4 µm thick) oxide layer followed by a chemical mechanical polishing (CMP) process to thin the oxide to approximately 1.5 µm in thickness (as discussed further below in conjunction with FIG. 3A). The thick initial oxide serves to fill voids and surface features present on the support structure that may be present after fabrication of the polycrystalline core and continue to be present as the encapsulating layers illustrated in FIG. 1A are formed. The CMP process provides a substantially planar surface free of voids, particles, or other features, which can then be used during a wafer transfer process to bond the substantially single crystal layer represented by the exfoliated single crystal silicon (111) layer illustrated in FIG. 1A to the bonding layer. It will be appreciated that the bonding layer does not have to be characterized by an atomically flat surface, but should provide a substantially planar surface that will support bonding of the substantially single crystal layer (e.g., a single crystal silicon layer) with the desired reliability.

An example of a layer transfer process that can be used to join a substantially single crystal layer to the bonding layer is the bonding of a hydrogen implanted donor wafer (e.g., a silicon wafer including a substantially single crystal layer (e.g., a single crystal silicon layer) that is implanted to form a cleave plane) to the bonding layer. The bonded pair is then annealed at an annealing temperature (e.g., 200° C.) for an annealing period (e.g., 4 hours) to cluster the implant species (e.g., hydrogen) into blisters. After annealing, the donor wafer fractures along the cleave plane and exfoliates a layer of substantially single crystal material onto the bonding layer. As illustrated in FIG. 1A, the layer of Si (111) is exfoliated onto the PECVD bonding layer. One of ordinary skill in the art would recognize many variations, modifications, and alternatives.

The method illustrated in FIG. 1B may also include smoothing the substantially single crystal layer (174). Referring to FIG. 1A, substantially single crystal layer 125 can be a single crystalline silicon (e.g., a Si (111) layer) that is transferred onto the bonding layer 120. The thickness of the substantially single crystal layer 125 can be varied to meet the specifications of various applications. Moreover, the crystal orientation of the substantially single crystal layer 125 can be varied to meet the specifications of the application. Additionally, the doping levels and profile in the substantially single crystal layer 125 can be varied to meet the specifications of the particular application. The smoothing illustrated in relation to reference number 174 can also include thinning of the substantially single crystal layer as a component of the smoothing process.

In some embodiments, the thickness and the surface roughness of the substantially single crystal layer 125 can be further modified for high quality epitaxial growth. Different device applications may have slightly different specifications regarding the thickness and surface smoothness of the substantially single crystal layer 125. The cleave process delaminates the substantially single crystal layer 125 from a bulk single crystal silicon wafer at the peak of an implanted ion profile. After cleaving, the substantially single crystal layer 125 can be adjusted or modified in several aspects before it is utilized as a growth surface for epitaxial growth of other materials, such as gallium nitride.

First, the transferred substantially single crystal layer 125 may contain a small amount of residual hydrogen concentration and may have some crystal damage from the implant. Therefore, it may be beneficial to remove a thin portion of the transferred substantially single crystal layer 125 where the crystal lattice is damaged. In some embodiments, the depth of the implant may be adjusted to be greater than the desired final thickness of substantially single crystal layer 125. The additional thickness allows for the removal of the thin portion of the transferred substantially single crystal layer that is damaged, leaving behind the undamaged portion of the desired final thickness.

Second, it may be desirable to adjust the total thickness of the substantially single crystal layer 125. In general, it may be desirable to have the substantially single crystal layer 125 thick enough to provide a high quality lattice template for the subsequent growth of one or more epitaxial layers but thin enough to be highly compliant. The substantially single crystal layer 125 may be said to be "compliant" when the substantially single crystal layer 125 is relatively thin such that its physical properties (e.g., CTE) closely mimic those of the materials surrounding it. The compliance of the substantially single crystal layer 125 may be inversely related to the thickness of the substantially single crystal layer 125. A higher compliance can result in lower defect densities in the epitaxial layers grown on the template and enable thicker epitaxial layer growth. In some embodiments, the thickness of the substantially single crystal layer 125 may be increased by epitaxial growth of silicon on the exfoliated silicon layer.

Third, it may be beneficial to improve the smoothness of the substantially single crystal layer 125. The smoothness of the layer may be related to the total hydrogen dose, the presence of any co-implanted species, and the annealing conditions used to form the hydrogen-based cleave plane. The initial roughness resulting from the layer transfer (i.e., the cleave step) may be mitigated by thermal oxidation and oxide strip, as discussed below.

In some embodiments, the removal of the damaged layer and adjusting the final thickness of the substantially single crystal layer 125 may be achieved through thermal oxidation of a top portion of the exfoliated silicon layer, followed by an oxide layer strip with hydrogen fluoride (HF) acid. For example, an exfoliated silicon layer having an initial thickness of 0.5 μm may be thermally oxidized to create a silicon dioxide layer that is about 420 nm thick. After removal of the grown thermal oxide, the remaining silicon thickness in the transferred layer may be about 53 nm. During thermal oxidation, implanted hydrogen may migrate toward the surface. Thus, the subsequent oxide layer strip may remove some damage. Also, thermal oxidation is typically performed at a temperature of 1000° C. or higher. The elevated temperature can may also repair lattice damage.

The silicon oxide layer formed on the top portion of the substantially single crystal layer during thermal oxidation can be stripped using HF acid etching. The etching selectivity between silicon oxide and silicon ($SiO_2$:Si) by HF acid may be adjusted by adjusting the temperature and concentration of the HF solution and the stoichiometry and density of the silicon oxide. Etch selectivity refers to the etch rate of one material relative to another. The selectivity of the HF solution can range from about 10:1 to about 100:1 for ($SiO_2$:Si). A high etch selectivity may reduce the surface roughness by a similar factor from the initial surface roughness. However, the surface roughness of the resultant substantially single crystal layer 125 may still be larger than desired. For example, a bulk Si (111) surface may have a root-mean-square (RMS) surface roughness of less than 0.1 nm as determined by a 2 μm×2 μm atomic force microscope (AFM) scan before additional processing. In some embodiments, the desired surface roughness for epitaxial growth of gallium nitride materials on Si (111) may be, for example, less than 1 nm, less than 0.5 nm, or less than 0.2 nm, on a 30 μm×30 μm AFM scan area.

If the surface roughness of the substantially single crystal layer 125 after thermal oxidation and oxide layer strip exceeds the desired surface roughness, additional surface smoothing may be performed. There are several methods of smoothing a silicon surface. These methods may include hydrogen annealing, laser trimming, plasma smoothing, and touch polish (e.g., chemical mechanical polishing or CMP). These methods may involve preferential attack of high aspect ratio surface peaks. Hence, high aspect ratio features on the surface may be removed more quickly than low aspect ratio features, thus resulting in a smoother surface.

FIG. 1C is a simplified schematic diagram illustrating an engineered substrate structure including an epitaxial layer according to an embodiment of the present invention. As illustrated in FIG. 1C, planarized layer 705, which can be a planarized version of substantially single crystal layer 125 is utilized in a growth process for the formation of epitaxial layer 710. Planarized layer 705 can be fabricated using one or more of the planarization techniques discussed herein. In some embodiments, the epitaxial layer 710 includes a GaN-based layer 2 μm to 10 μm in thickness, or thicker, which can be utilized as one of a plurality of layers utilized in optoelectronic devices.

It should be appreciated that the specific steps illustrated in FIG. 1B provide a particular method of fabricating an engineered substrate according to an embodiment of the present invention. Other sequences of steps may also be performed according to alternative embodiments. For example, alternative embodiments of the present invention may perform the steps outlined above in a different order. Moreover, the individual steps illustrated in FIG. 1B may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 2:
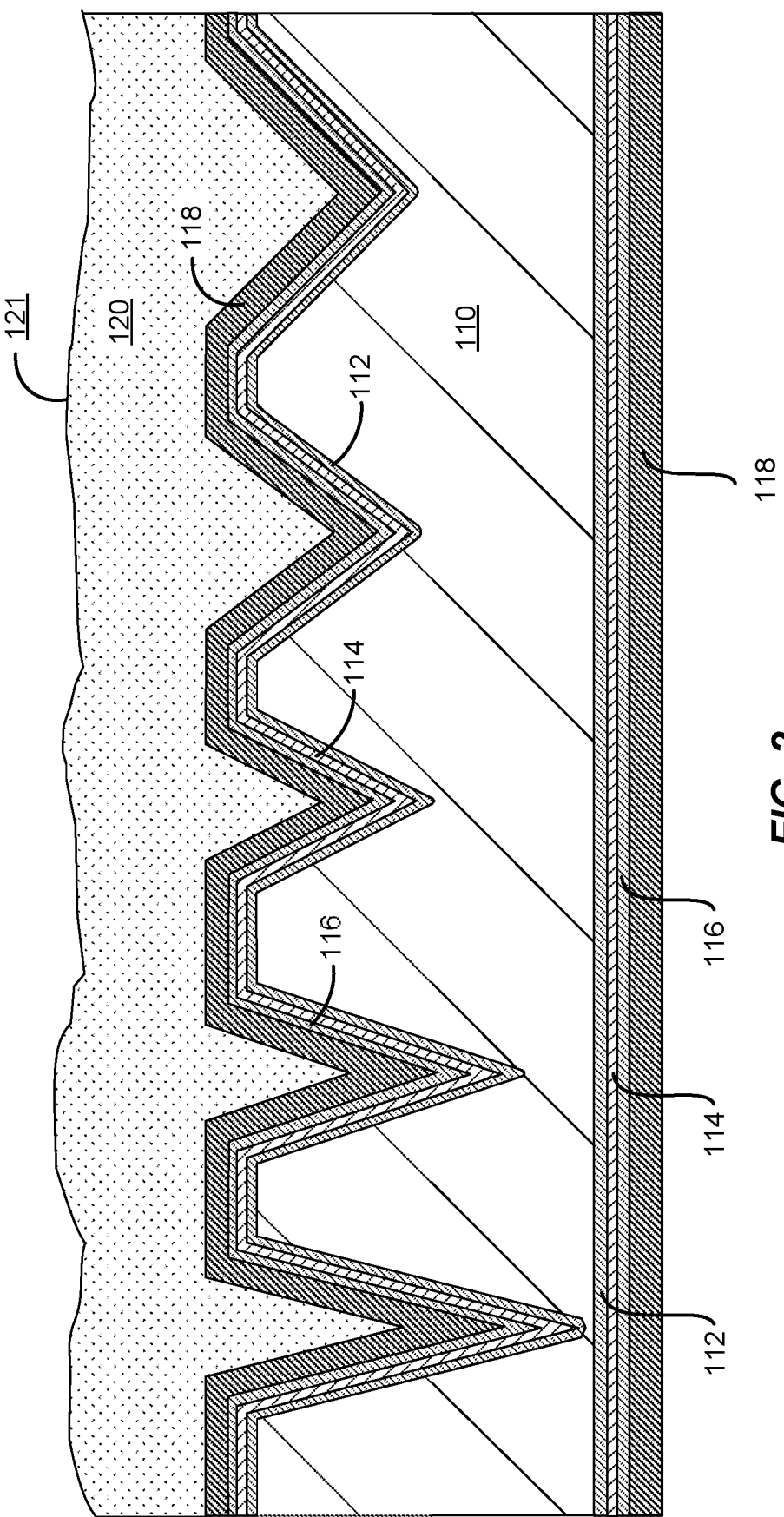
FIG. 2 is a simplified schematic diagram illustrating an engineered substrate structure after deposition of a bonding layer according to an embodiment of the present invention.

FIG. 2 is a simplified schematic diagram illustrating an engineered substrate structure after deposition of a bonding layer according to an embodiment of the present invention. As illustrated in FIG. 2, the top surface 121 of bonding layer 120 (e.g., PECVD oxide) is naturally rough, with the surface profile determined, to some extent, by the surface roughness of the underlying layers and materials. As discussed in relation to FIG. 1B, the initial thickness of the bonding layer can be on the order of several microns (e.g., 4 μm) in order for the bonding layer to fill in the porosity present in the polycrystalline ceramic core 110. The bonding layer can be formed in a single step process or a multi-step process, for example a repeated cycle of deposition/removal. As an example, deposition of bonding layer material could be followed by polishing of the bonding layer to reduce the thickness and increase the planarity. This cycle of deposition/polishing could then be repeated several times to provide a bonding layer with a surface roughness that is less than the surface roughness characterizing the original polycrystalline ceramic core surface. Moreover, different materials can be utilized for the different cycles, providing a layered structure with multiple materials. One of ordinary skill in the art would recognize many variations, modifications, and alternatives.

Figure 3A:
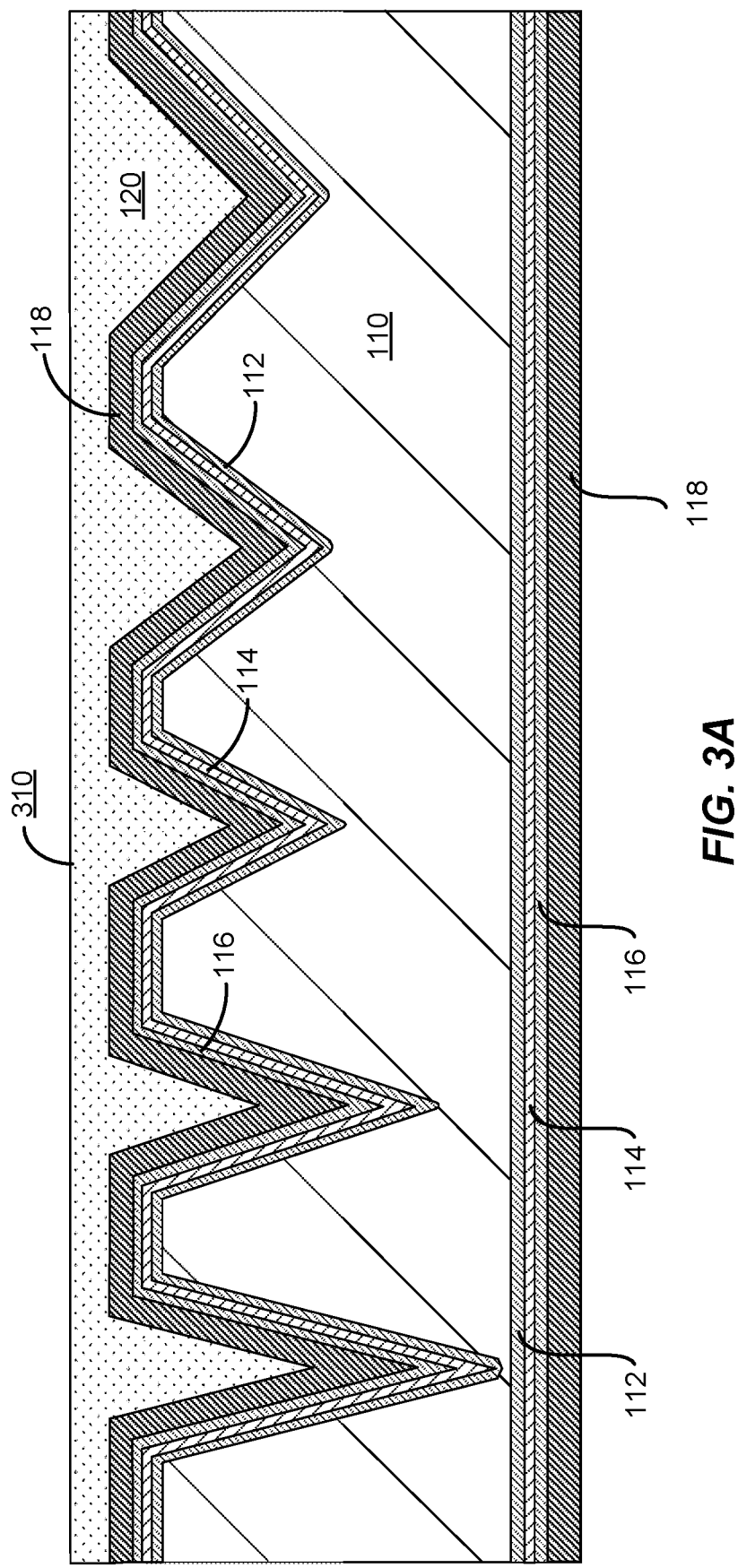
FIG. 3A is a simplified schematic diagram illustrating an engineered substrate structure after thinning of the bonding layer according to an embodiment of the present invention.

FIG. 3A is a simplified schematic diagram illustrating an engineered substrate structure after thinning of the bonding layer according to an embodiment of the present invention. The inventors have determined that heat transfer, and capacitive effects, which impact switching speeds, and the like, are improved for device applications or can be customized to the device application by thinning the bonding layer (e.g., the PECVD oxide layer) from the initial value of several microns to values in the range of 100 Å to 1.5 μm.

As illustrated in FIG. 3A, a CMP process can be used to reduce the thickness of the bonding layer 120. However, if the initial thickness of the bonding layer is on the order of several microns (e.g., 4 μm), which is appropriate in order for the bonding layer to fill in the porosity present in the polycrystalline ceramic core, a CMP process may not be able to smooth out all the imperfections present in the bonding layer. Moreover, the CMP pad compliance, slurry management, and control of the down force in various zones on the equipment present challenges to achieving flatness across the substrate, thereby providing a smooth and flat bonding layer. For example, roll off at the substrate edge can result in film thickness at the edges that is either less than (i.e., thinner) or greater than (i.e., thicker) than the mean layer thickness.

Although FIG. 3A illustrates a flat top surface 310, for realistic process flows, the variation in thickness of the bonding layer 120 will be in the range of 4,000 Å, resulting in thickness variations that are a considerable percentage of the layer thickness as the layer thickness decreases to 1.5 µm and below.

Figure 3B:
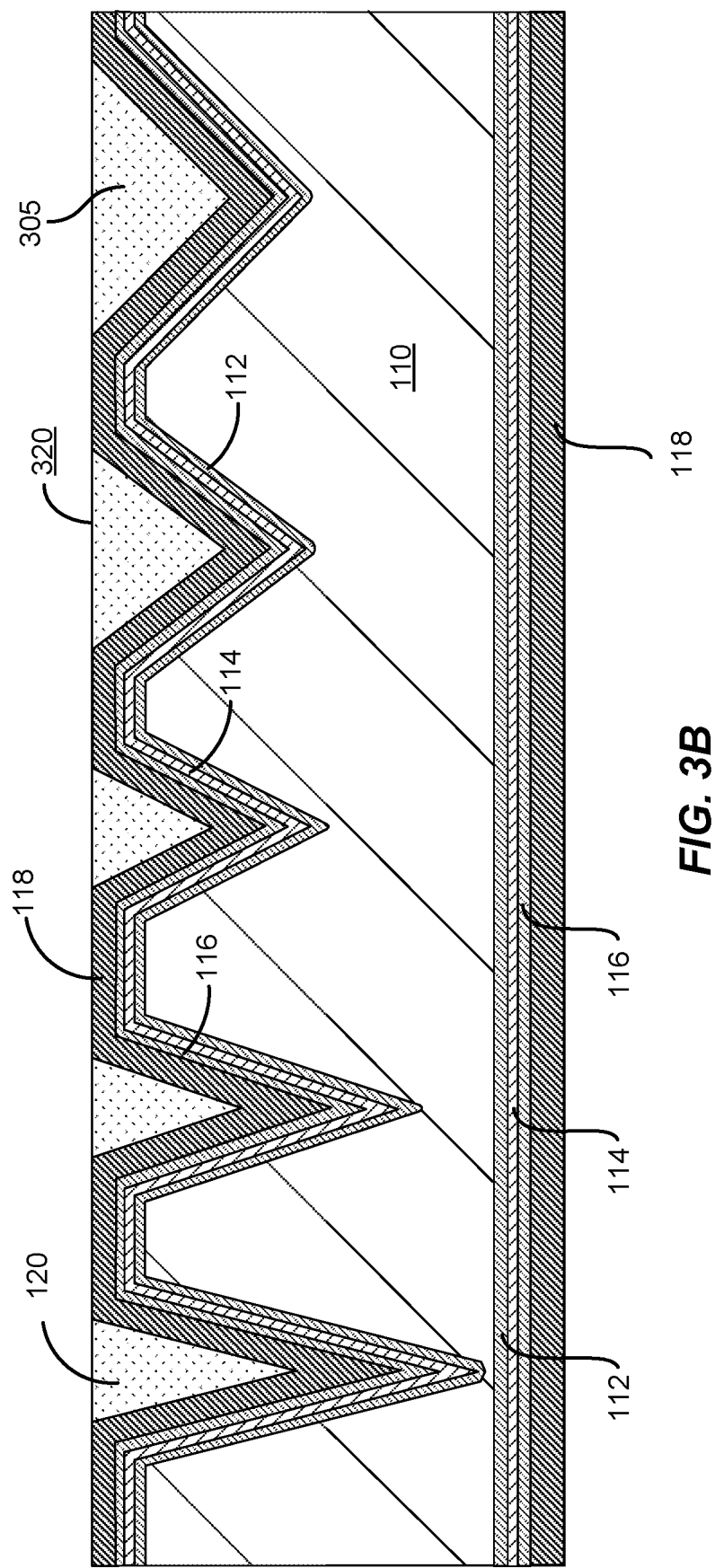
FIG. 3B is a simplified schematic diagram illustrating an engineered substrate structure after polishing to an etch stop layer according to an embodiment of the present invention.

FIG. 3B is a simplified schematic diagram illustrating an engineered substrate structure after polishing to an etch stop layer according to an embodiment of the present invention. As illustrated in FIG. 3B, the CMP process is terminated as the barrier layer 118 (e.g., silicon nitride) is exposed. The barrier layer material can provide a natural CMP stop layer since the hardness of the barrier layer material can be much greater than the bonding layer, which is soft in comparison.

Referring to FIG. 3B, the bonding layer 120 (e.g., the PECVD oxide) is thinned by a CMP process that uses the barrier layer 118 (e.g., the LPCVD Nitride) as a CMP stop layer. The difference in removal rate is triggered on the CMP tool and, in combination with thickness feedback systems, the CMP process will stop on the barrier (e.g., nitride) layer. It should be noted that in FIG. 3B, the quantity of pores present in the polycrystalline core is exaggerated for purposes of illustration. In practice, the relative surface area of the exposed barrier layer (i.e., coplanar nitride areas) is much greater than the surface area of the bonding layer represented by the PECVD oxide.

As illustrated in FIG. 3B, the top surface 320 of the substrate structure includes areas of the bonding layer material 120 (e.g., PECVD oxide) and areas of the barrier layer material 118 (e.g., LPCVD nitride). This top surface 320, which is electrically insulating, may provide a suitable bonding surface for bonding of a donor wafer as discussed above. In this example, a single crystal silicon layer could be bonded to the patchwork of oxide and nitride areas. The valleys or voids present between adjacent peaks in the polycrystalline ceramic core can be referred to as fill regions 305 since they are filled with the bonding layer material. One of ordinary skill in the art would recognize many variations, modifications, and alternatives.

In some embodiments, rather than using the barrier layer 118 as a CMP stop, an additional CMP stop layer is deposited before deposition of the bonding layer. Referring to FIG. 2, the additional CMP stop layer would be formed between the barrier layer 118 (e.g., a nitride layer) and the PECVD bonding layer 120. Accordingly, the CMP process would then terminate at the additional CMP stop layer, thereby protecting the barrier layer from removal or excessive thinning that may impair its barrier properties. The ability of the barrier layer to prevent diffusion of impurities depends on the thickness of the barrier layer and the rate of diffusion. If the barrier layer is too thin, the barrier layer may not provide adequate barrier functions.

Figure 3C:
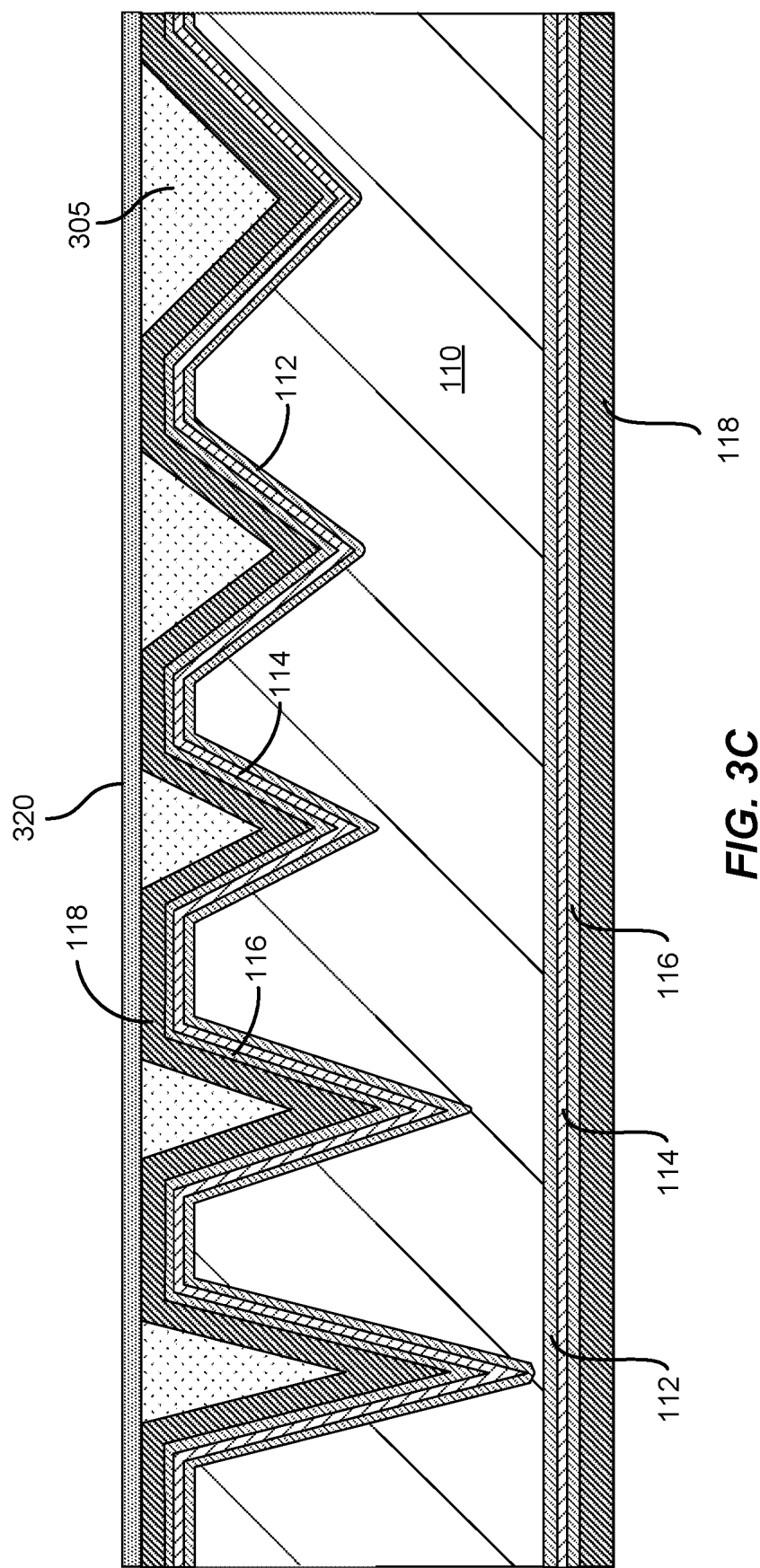
FIG. 3C is a simplified schematic diagram illustrating an engineered substrate structure after redeposition of a bonding layer according to an embodiment of the present invention.

FIG. 3C is a simplified schematic diagram illustrating an engineered substrate structure after redeposition of a bonding layer 320 according to an embodiment of the present invention. As an alternative to the bonding surface illustrated in FIG. 3B, a thin layer of a bonding material can be deposited after the CMP process. Referring to FIG. 3B, after the CMP process is used to remove the bonding layer material, stopping at the barrier layer 118, a thin layer (e.g., 200 Å) of very uniform bonding material (e.g., PECVD oxide) can be redeposited on the polished structure. The bonding layer 320 can be referred to as a redeposited layer. Because using a stop layer (either the barrier layer or an additional CMP stop layer) affords better control over the surface flatness compared to thinning without a stop layer, the surface of the bonding layer after the CMP process as illustrated in FIG. 3B may be relatively flat. Since the bonding layer 320 is conformal to the flattened surface of the bonding layer and the surface uniformity of the bonding layer 320 is a percentage of the total thickness of the bonding layer 320, the surface of the thin bonding layer 320 may be quite uniform. Thus, the bonding layer 320 provides a continuous bonding surface that has a superior surface flatness as compared to that achievable from applying CMP to a thick bonding layer without using a stop layer. Although PECVD oxide is illustrated as the bonding material in FIG. 3C, this is not required by the present invention and other materials, for example, silicon nitride, can be redeposited. Accordingly, embodiments of the present invention provide a thin and controllable bonding layer with properties that are independent of the bonding material utilized to increase the planarity of the polycrystalline ceramic core. One of ordinary skill in the art would recognize many variations, modifications, and alternatives.

In some embodiments, the CMP stop layer can be the polycrystalline ceramic core 110 (e.g., the AlN material in the core). In these embodiments, the barrier layer as well as the underlying adhesion layers and the conductive layer would be removed to expose the top surface of the core material.

Utilizing processes as described herein, the increase in planarity from the polycrystalline ceramic core to the redeposited layer 320 can be substantial. For example, in an embodiment, the growth surface of the ceramic substrate can be characterized by an RMS roughness in the range of 50-600 nm RMS for a 50 µm×50 µm area AFM scan, which is achievable with conventional wafer polishing techniques. Utilizing the processes described herein, the redeposited layer can be characterized by an RMS roughness in the range of 0.5-2 nm RMS for a 30 µm×30 µm area AFM scan, which provides an improvement in surface roughness of 2-3 orders of magnitude. The planarity of the pre-CMP layer can be as high as 30% of the total thickness of the layer. For a 4 µm layer, this might be 1.2 µm. The planarity of the surface after CMP on the stop layer is typical <2% or ~10× improvement in the planarity.

Figure 4:
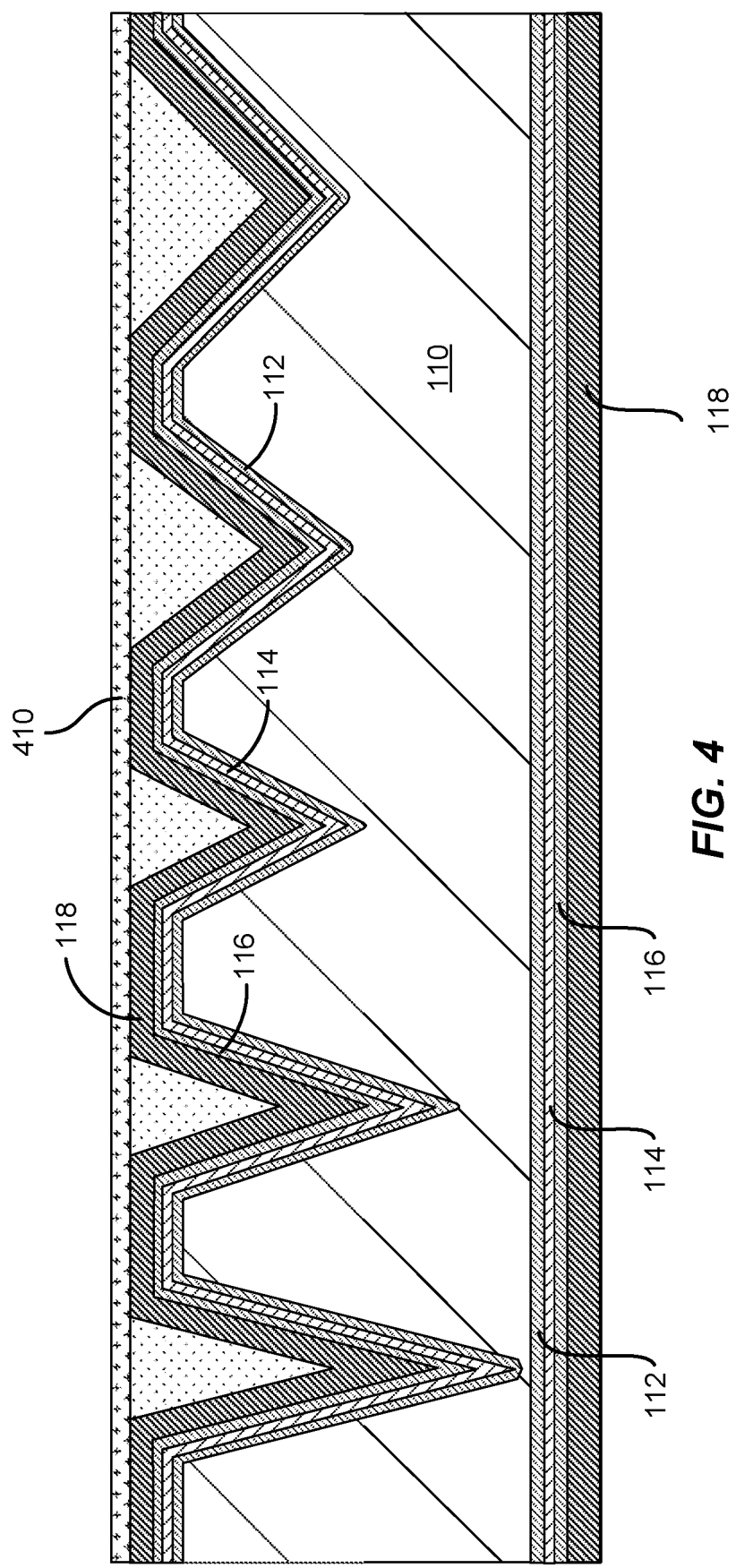
FIG. 4 is a simplified schematic diagram illustrating an engineered substrate structure after formation of one or more engineered layers according to an embodiment of the present invention.

FIG. 4 is a simplified schematic diagram illustrating an engineered substrate structure after formation of one or more engineered layers according to an embodiment of the present invention. Starting with the engineered substrate structure after thinning of the bonding layer as illustrated in FIG. 3A or 3B, one or more engineered layers, which may include one or more dielectric layers, are formed or deposited on the thinned engineered substrate structure. As illustrated in FIG. 4, an engineered layer 410 that provides good adhesion to the barrier layer 118 and the bonding layer 120 material (e.g., PECVD oxide) can be deposited such that it covers the exposed barrier layer portions and the fill regions.

The engineered layer(s) can be formed using a variety of materials. As examples, dielectric materials may include Silicon Nitride, OxyNitrides, silicon oxynitrides, spin on glass/dielectrics, DLC, combinations thereof, and the like. The thickness of the engineered layer(s) can range from very thin layers on the order of 100 Å to 200 Å to thick layers on the order of several microns (e.g., 2 µm) depending on the particular device specifications, including heat transfer, capacitance, and breakdown voltage characteristics. In some implementations, rather than dielectrics, conducting layers, including refractory metals are deposited as engineered layers. In other implementations, multi-layer structures that can include both one or more dielectric layers and one or more conducting layers are fabricated to provide desired thermal, mechanical, and electrical properties.

The engineered layer 410 illustrated in FIG. 4 enables processing capabilities that are expanded in comparison with the use of a bonding layer 320 that is formed using the same material as the bonding layer 120. Thus, the embodiment illustrated in FIG. 4 provides alternative bonding capabilities that are expanded in comparison with the embodiment illustrated in FIG. 3C.

Figure 5:
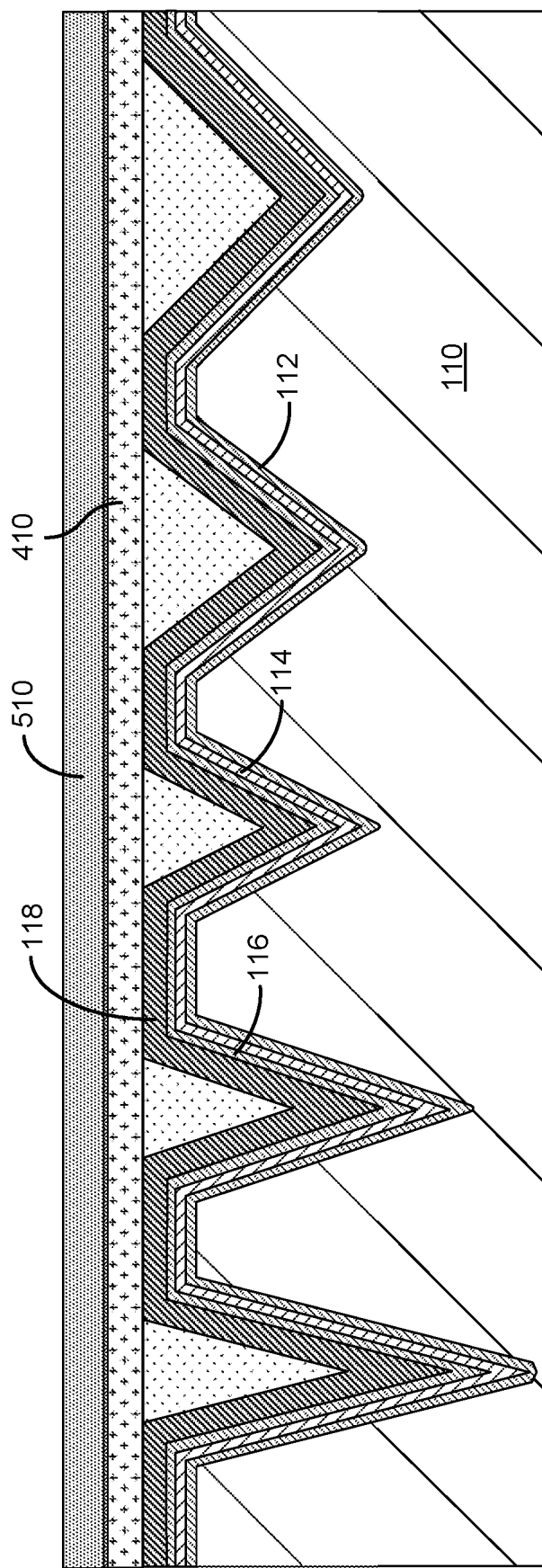
FIG. 5 is a simplified schematic diagram illustrating an engineered substrate structure including an exfoliated layer according to an embodiment of the present invention.

FIG. 5 is a simplified schematic diagram illustrating an engineered substrate structure including an exfoliated layer 510 according to an embodiment of the present invention. The structure illustrated in FIG. 5 utilizes the one or more engineered layers illustrated in FIG. 4 to provide a bond interface between the engineered layer(s) and the substantially single crystal layer 510, which can be an exfoliated single crystal silicon (111) layer.

The thickness of the exfoliated layer 510 can be varied to meet the specifications of various applications. Moreover, the crystal orientation of the exfoliated layer can be varied to meet the specifications of the application. As an example, the crystal orientation can be controlled to provide for strain in the ensuing epitaxial layers grown after fabrication of the structure illustrated in FIG. 5. Additionally, the doping levels and profile in the exfoliated layer can be varied to meet the specifications of the particular application. It should be noted that the exfoliated layer can be integrated with other engineered substrates structures as described herein, including the engineered substrate structures illustrated in FIGS. 1A, 3A, 3B, 3C, and 4.

As an alternative to the process flows and structures discussed above, some embodiments of the present invention increase the planarity of the polycrystalline ceramic core before deposition of conductive and barrier layers. Thus, some embodiments provide surface treatment processes for the polycrystalline ceramic core before formation of the engineered stacks described herein in order to increase the planarity of the polycrystalline ceramic core surface before formation of conductive, barrier, and other layers.

FIG. 6A is a simplified schematic diagram illustrating a polycrystalline ceramic core and a planarization material according to an embodiment of the present invention. The polycrystalline ceramic core 110 is illustrated as an AlN substrate. An adhesion promotion layer 610 is formed on one or more sides of the polycrystalline ceramic core and a planarization material 620 (e.g., PECVD oxide fill layer) is deposited on the adhesion promotion layer 610. The adhesion promotion layer can be TEOS oxide as discussed herein, for example, 100 Å to 1,000 Å of TEOS oxide, or other suitable materials. The planarization material 620 can be oxides, nitride, spin-on-glass (SOG), or other suitable materials. In some embodiments for which the planarization material adheres well to the polycrystalline ceramic core, the adhesion promotion layer is removed. The thickness of the planarization material is selected to provide for filling of the voids and surface features present in the polycrystalline ceramic core and can be on the order of several microns in thickness. One of ordinary skill in the art would recognize many variations, modifications, and alternatives.

FIG. 6B is a simplified schematic diagram illustrating a polycrystalline ceramic core and a planarization material after a CMP process according to an embodiment of the present invention. After deposition of the planarization material 620, a CMP process is used in which the polycrystalline ceramic core 110 (AlN substrate) is the CMP stop, thereby polishing away the overburden of the planarization material. As illustrated in FIG. 6B, the presence of the polycrystalline ceramic core material as the CMP stop results in a negligible amount (e.g., only 50 Å-100 Å of the planarization material outside the voids. This reduction in the amount of oxide or other thermally insulating material increases the thermal conductivity of the finished substrate structure and the eventual devices fabricate thereon. Since the polycrystalline ceramic core has a high thermal conductivity, reducing the thickness of the oxide or other thermally insulating layers can have a significant impact on overall thermal performance. In some embodiments, a thin dielectric layer (e.g., oxide or nitride) is deposited after the completion of the CMP process.

Figure 6C:
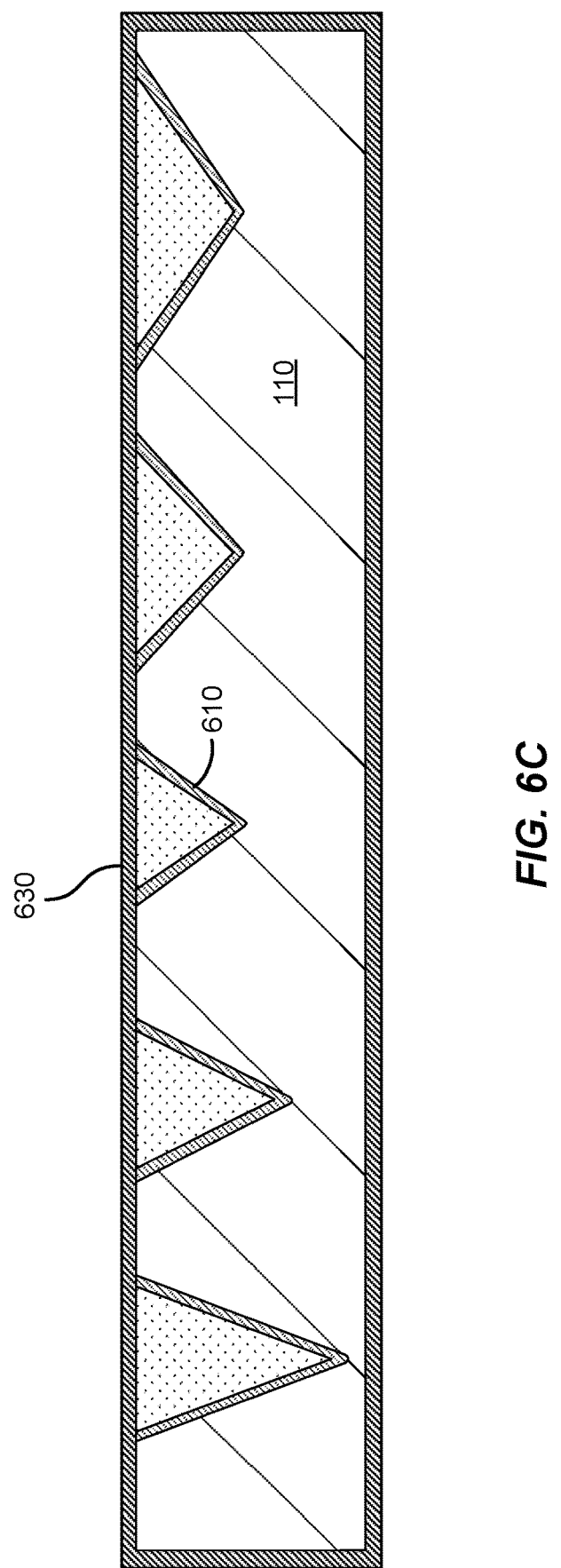
FIG. 6C is a simplified schematic diagram illustrating a planarized polycrystalline ceramic core encapsulated in a barrier shell according to an embodiment of the present invention.

FIG. 6C is a simplified schematic diagram illustrating a planarized polycrystalline ceramic core encapsulated in a barrier shell according to an embodiment of the present invention. A barrier layer 630 (e.g., silicon nitride) is deposited, and as illustrated in FIG. 6C, the barrier layer 630 encapsulates the polycrystalline ceramic core 110 and can be made from one or more materials including $Si_3N_4$, oxynitride, diamond like carbon (DLC), other suitable materials, combinations thereof, and the like. In an embodiment, an LPCVD process is utilized or a suitable furnace process to completely encapsulate the polycrystalline ceramic core.

Barrier layer 630, for example, a silicon nitride layer, is formed surrounding the polycrystalline ceramic core. In an embodiment, the barrier layer is a silicon nitride layer that is on the order of 2,000 Å to 5,000 Å in thickness. The barrier layer completely surrounds the polycrystalline ceramic core in some embodiments to form a fully encapsulated structure. In addition to silicon nitride layers, amorphous materials including SiCN, SiON, AlN, SiC, and the like can be utilized as barrier layers. In some implementations, the barrier layer 630 consists of a number of sub-layers that are built up to form the barrier layer. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 630, e.g., a silicon nitride layer, prevents diffusion and/or outgassing of elements present in the polycrystalline ceramic core, for example, yttrium (elemental), yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments, can be utilized in semiconductor process flows and clean room environments.

Figure 6D:
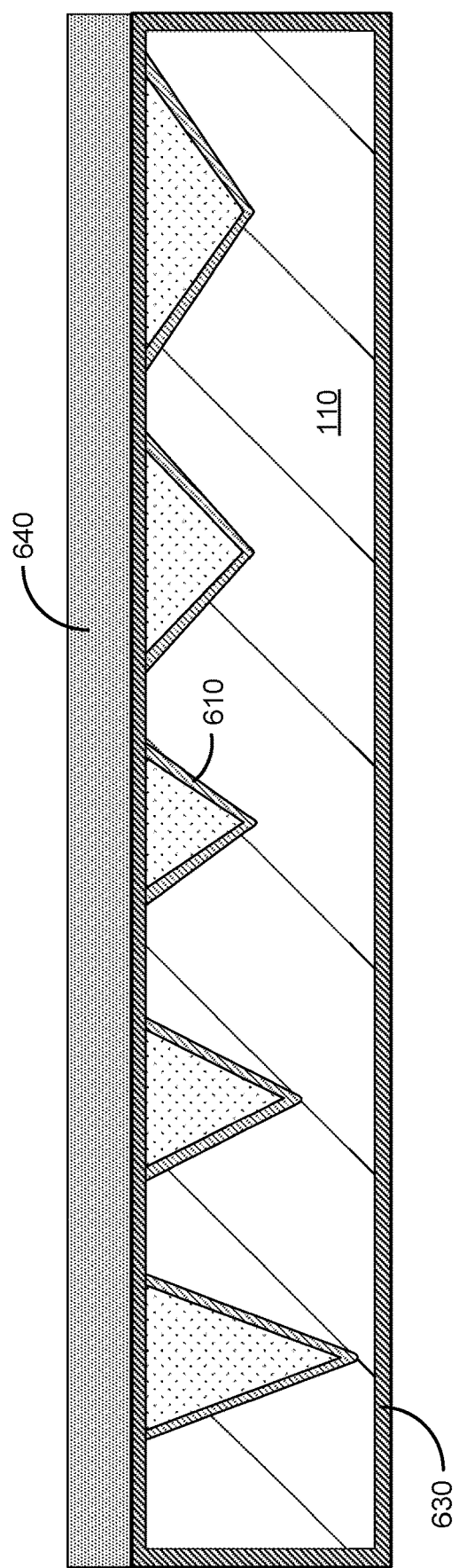
FIG. 6D is a simplified schematic diagram illustrating a planarized polycrystalline ceramic core encapsulated in a barrier shell with an exfoliated single crystal Si layer according to an embodiment of the present invention.

FIG. 6D is a simplified schematic diagram illustrating a planarized polycrystalline ceramic core encapsulated in a barrier shell with an exfoliated single crystal silicon layer according to an embodiment of the present invention. An exfoliated layer 640, for example, a single crystal silicon layer, is formed on the barrier layer 630, for example a silicon nitride layer. The thickness of the exfoliated layer 640 can be varied to meet the specifications of various applications. Moreover, the crystal orientation of the exfoliated layer 640 can be varied to meet the specifications of the application. Additionally, the doping levels and profile in the exfoliated layer can be varied to meet the specifications of the particular application. The exfoliated single crystal silicon layer (e.g., exfoliated Si (111)) is suitable for use as a growth layer during an epitaxial growth process for the formation of epitaxial materials. In some embodiments, the epitaxial material can include a GaN layer 2 μm to 10 μm in thickness, which can be utilized as one of a plurality of layers utilized in optoelectronic, RF, and power devices. Although a single crystal silicon layer is illustrated in FIG. 6D, other substantially single crystal layers can be utilized according to embodiments of the present invention.

Figure 6E:
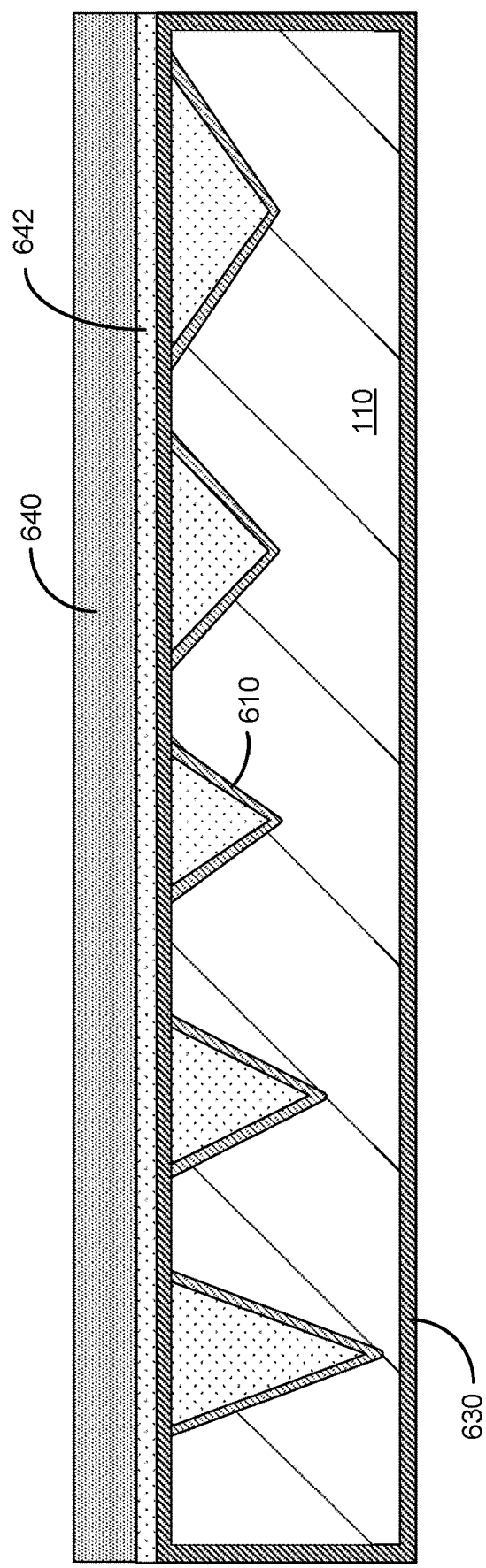
FIG. 6E is a simplified schematic diagram illustrating a planarized polycrystalline ceramic core encapsulated in a barrier shell topped with a deposited oxide and an exfoliated single crystal Si layer according to an embodiment of the present invention.

FIG. 6E is a simplified schematic diagram illustrating a planarized polycrystalline ceramic core encapsulated in a barrier shell topped with a deposited oxide and an exfoliated single crystal silicon layer according to an embodiment of the present invention. In this embodiment, an oxide layer 642 (e.g., a silicon oxide layer) is deposited on the barrier layer 630. The oxide layer 642 may serve as a bond interface between the barrier layer 630 and the exfoliated layer 640, which can be a single crystal silicon layer. According to some embodiments, the oxide layer may have a thickness of a few hundred angstroms. Although a single crystal silicon layer is illustrated in FIG. 6E, other substantially single crystal layers can be utilized according to embodiments of the present invention.

Figure 6F:
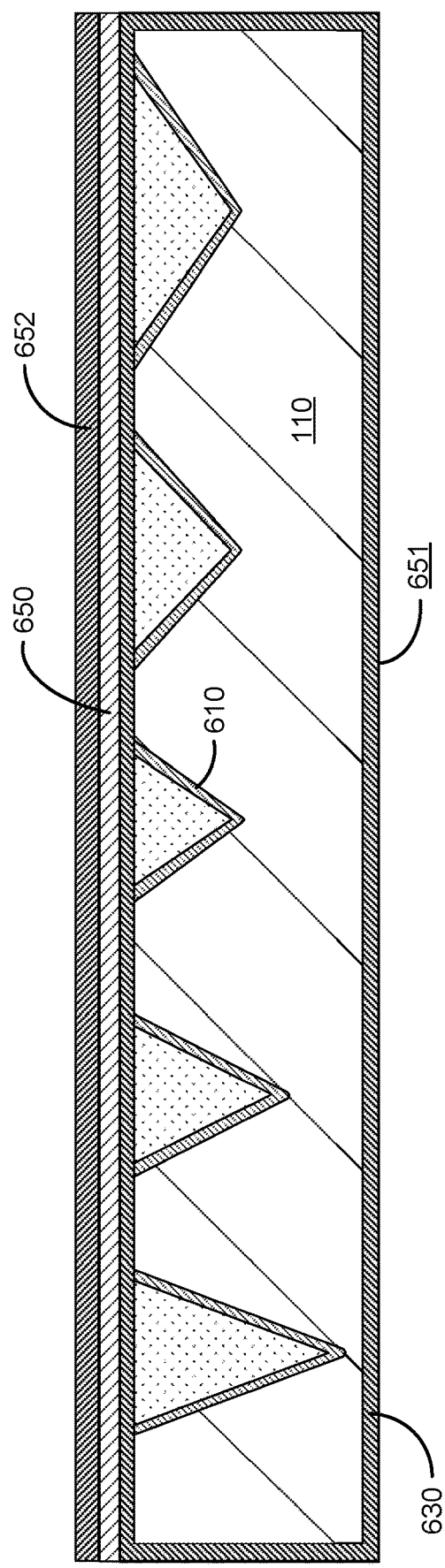
FIG. 6F is a simplified schematic diagram illustrating formation of engineered layers on an encapsulated and planarized polycrystalline ceramic core according to an embodiment of the present invention.

FIG. 6F is a simplified schematic diagram illustrating formation of engineered layers on an encapsulated and planarized polycrystalline ceramic core according to an embodiment of the present invention. FIG. 6F illustrates the deposition of conductive layers 650 for chucking, including metallic layers (e.g., W, Ti, or the like), polysilicon layers, combinations thereof, or the like. In addition to conductive layers, thermal management layers 652 (e.g., DLC, SiON, silicon nitride, or the like) can be deposited to provide for high thermal conductivity across the substrate.

Although only the barrier layer 630 is illustrated as encapsulating the polycrystalline ceramic core in FIG. 6F, this is not required by the present invention. Other layers can be formed as shells, including the conductive layer(s) and the thermal management layer(s). In some implementations, the conductive layer 650 is formed on the bottom or back side 651 of the substrate structure as appropriate for chucking and the thermal management layers are formed on the top or front side of the substrate structure to conduct heat generated in devices laterally. Thus, whether or not layers are formed as encapsulating shells, the position of the layers with respect to the polycrystalline ceramic core can be varied according to embodiments of the present invention. Additionally, adhesion promotion layers and other suitable layers can be inserted as appropriate to the particular application.

Figure 6G:
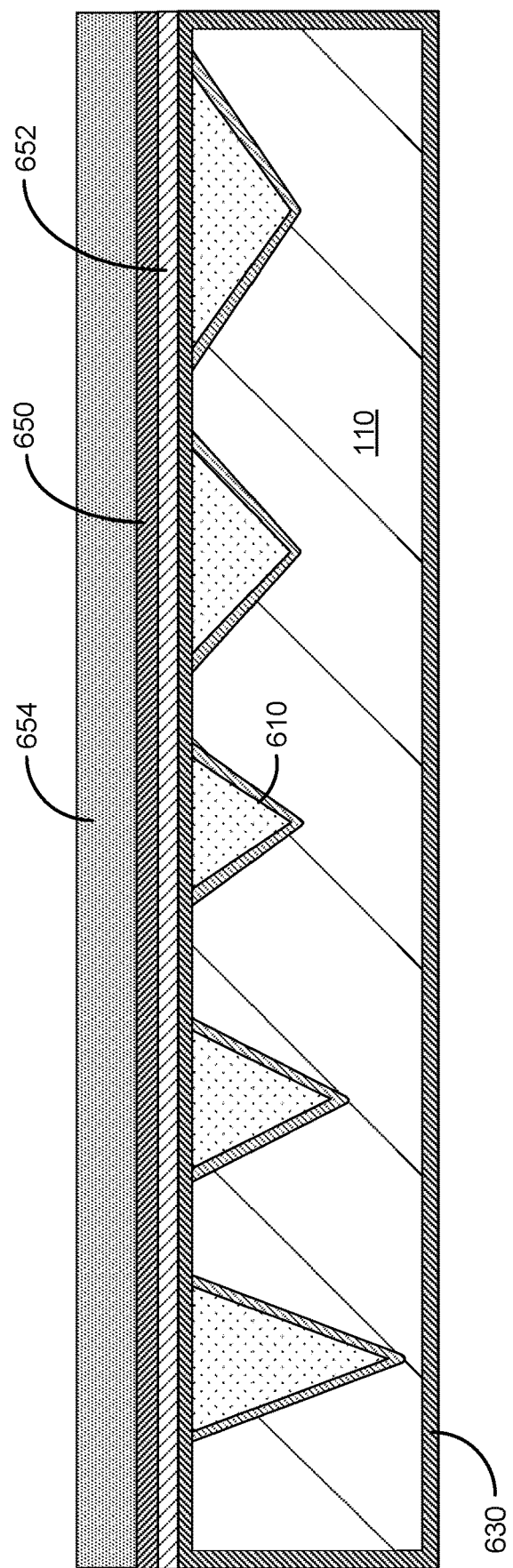
FIG. 6G is a simplified schematic diagram illustrating an exfoliated Si layer on top of the engineered layers on an encapsulated and planarized polycrystalline ceramic core according to an embodiment of the present invention.

FIG. 6G is a simplified schematic diagram illustrating an exfoliated Si layer 654 on top of the engineered layers on an encapsulated and planarized polycrystalline ceramic core according to an embodiment of the present invention. The thickness of the exfoliated layer 654 can be varied to meet the specifications of various applications. Moreover, the crystal orientation of the exfoliated layer can be varied to meet the specifications of the application. Additionally, the doping levels and profile in the exfoliated layer can be varied to meet the specifications of the particular application. As an example, an exfoliated single crystal silicon layer (e.g., exfoliated Si (111)) is suitable for use as a growth layer during an epitaxial growth process for the formation of epitaxial materials. In some embodiments, the epitaxial material (not shown) can include a GaN layer 2 µm to 10 µm in thickness, which can be utilized as one of a plurality of layers utilized in optoelectronic, RF, and power devices. Although a single crystal silicon layer is illustrated in FIG. 6G, other substantially single crystal layers can be utilized according to embodiments of the present invention.

Figure 6H:
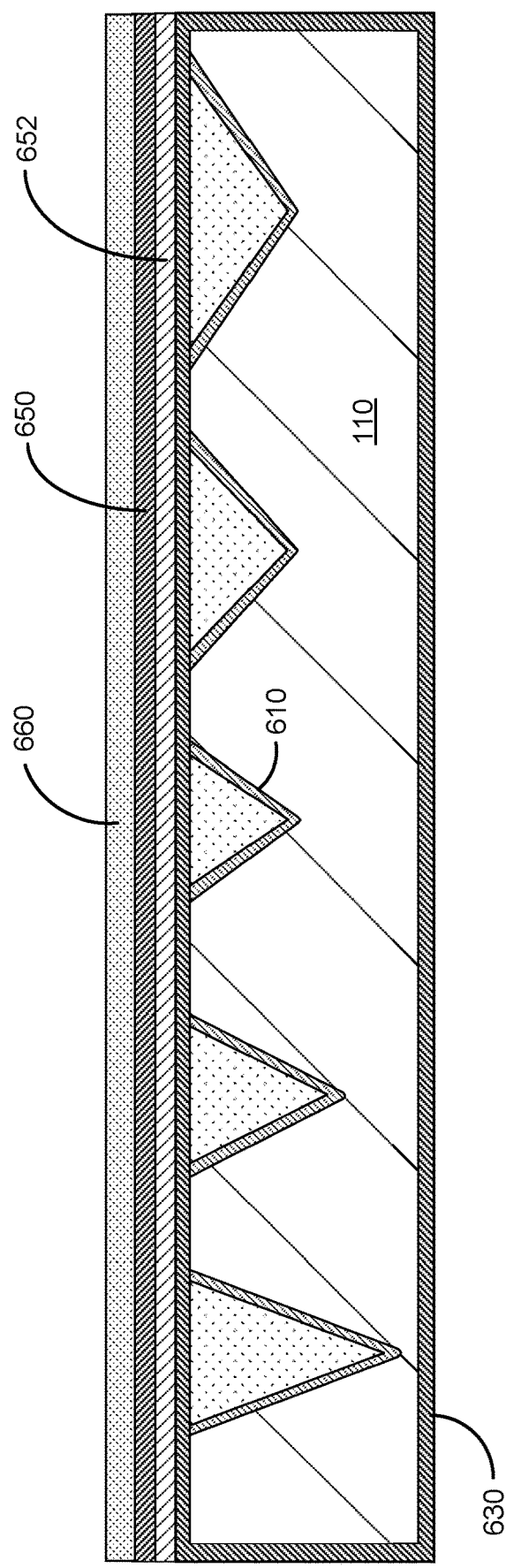
FIG. 6H is a simplified schematic diagram illustrating formation of a bonding layer on engineered layers on an encapsulated and planarized polycrystalline ceramic core according to an embodiment of the present invention.

FIG. 6H is a simplified schematic diagram illustrating formation of a bonding layer 660 on engineered layers on an encapsulated and planarized polycrystalline ceramic core according to an embodiment of the present invention. In order to provide a suitable bonding surface in the event that the engineered layers (e.g., conductive layers 650 and thermal management layers 652) illustrated in FIG. 6F are not suitable for bonding, a layer of silicon oxide (e.g., 10 nm-20 nm of PECVD oxide), other dielectrics, or other suitable bonding material can be deposited as a bonding layer 660 to promote bonding. Alternatively the oxide may be on the donor wafer.

It should be noted that the layers illustrated in FIG. 6H can be modified in several ways, including the order of deposition (e.g., conductive/thermal/bonding or thermal/conductive/bonding), the barrier shell can be formed after deposition of one or more of the conductive and thermal layers, and the like. In some embodiments, one or more layers are removed from the substrate structure. Moreover, each of the layers can include sub-layers. Although the conductive and thermal layers are only illustrated on one side of the substrate, they can be formed on other sides as well depending on the particular application. One of ordinary skill in the art would recognize many variations, modifications, and alternatives.

Figure 6I:
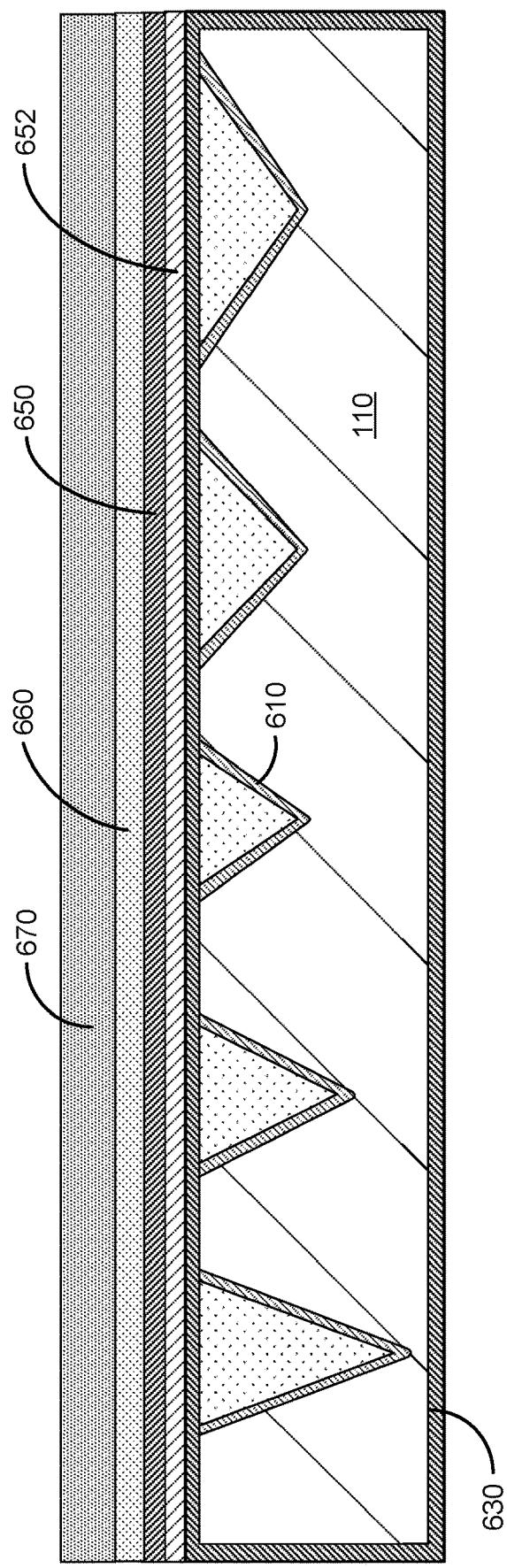
FIG. 6I is a simplified schematic diagram illustrating formation of a bonding layer on engineered layers on an encapsulated and planarized polycrystalline ceramic core with an exfoliated Si layer on top according to an embodiment of the present invention.

FIG. 6I is a simplified schematic diagram illustrating formation of a bonding layer 660 on engineered layers on an encapsulated and planarized polycrystalline ceramic core with an exfoliated layer 670 (e.g., Si) on top according to an embodiment of the present invention. The thickness of the exfoliated layer can be varied to meet the specifications of various applications. Moreover, the crystal orientation of the exfoliated layer 670 can be varied to meet the specifications of the application. Additionally, the doping levels and profile in the exfoliated layer can be varied to meet the specifications of the particular application. An exfoliated single crystal silicon layer (e.g., exfoliated Si (111)) is suitable for use as a growth layer during an epitaxial growth process for the formation of epitaxial materials. In some embodiments, the epitaxial material (not shown) can include a GaN layer 2 µm to 10 µm in thickness, which can be utilized as one of a plurality of layers utilized in optoelectronic, RF, and power devices. Although a single crystal silicon layer is illustrated in FIG. 6I, other substantially single crystal layers can be utilized according to embodiments of the present invention.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An engineered substrate structure comprising:
    a ceramic substrate having a front surface characterized by a plurality of voids, the ceramic substrate comprising a polycrystalline material;
    a barrier layer encapsulating the ceramic substrate, the barrier layer defining a plurality of valleys corresponding to the plurality of voids;
    a first bonding layer comprising a bonding layer material and coupled to the barrier layer on the front surface of the ceramic substrate, the first bonding layer defining a plurality of fill regions filled with the bonding layer material in the plurality of valleys corresponding to the plurality of voids;
    a second bonding layer coupled to the first bonding layer; and
    a substantially single crystalline layer joined to the second bonding layer.

2. The engineered substrate structure of claim 1 wherein the ceramic substrate comprises polycrystalline aluminum nitride.

3. The engineered substrate structure of claim 1 wherein the barrier layer comprises silicon nitride.

4. The engineered substrate structure of claim 1 wherein the front surface of the ceramic substrate is characterized by a root mean square (RMS) roughness in a range of 50-600 nm, and the second bonding layer is characterized by an RMS roughness in a range of 0.5-5 nm.

5. The engineered substrate structure of claim 1 wherein the bonding layer material of the first bonding layer comprises silicon oxide, and the second bonding layer comprises silicon oxide.

6. The engineered substrate structure of claim 5 wherein the second bonding layer has a thickness of between 100 nm and 1,000 nm.

7. The engineered substrate structure of claim 1 wherein the second bonding layer comprises a different material than the bonding layer material of the first bonding layer.

8. The engineered substrate structure of claim 7 wherein the bonding layer material of the first bonding layer comprises silicon oxide, and the second bonding layer comprises diamond-like carbon (DLC).

9. The engineered substrate structure of claim 1 wherein the substantially single crystalline layer comprises single crystal silicon.

10. The engineered substrate structure of claim 1 wherein the substantially single crystalline layer comprises single crystal $Ga_2O_3$.

11. The engineered substrate structure of claim 1 wherein the substantially single crystalline layer comprises single crystal SiC.

12. The engineered substrate structure of claim 1 wherein the substantially single crystalline layer comprises single crystal GaN.

13. The engineered substrate structure of claim 1 wherein the substantially single crystalline layer comprises single crystal sapphire.

14. An engineered substrate structure comprising:
a ceramic substrate having a front surface characterized by a plurality of peaks, the ceramic substrate comprising a polycrystalline material;
a bonding layer comprising a bonding layer material and coupled to the front surface of the ceramic substrate, the bonding layer defining fill regions filled with the bonding layer material between adjacent peaks of the plurality of peaks on the front surface of the ceramic substrate;
a barrier layer encapsulating the ceramic substrate and the bonding layer; and
a substantially single crystal layer coupled to the barrier layer.

15. The engineered substrate structure of claim 14 further comprising an adhesion promotion layer disposed between the front surface of the ceramic substrate and the bonding layer.

16. The engineered substrate structure of claim 14 further comprising an electrically conductive layer coupled to at least a portion of the barrier layer.

17. The engineered substrate structure of claim 14 further comprising a thermally conductive layer coupled to at least a portion of the barrier layer.

18. The engineered substrate structure of claim 14 further comprising a second bonding layer coupled to at least a portion of the barrier layer, and the substantially single crystal layer is coupled to the barrier layer through the second bonding layer.

19. The engineered substrate structure of claim 14 further comprising:
an electrically conductive layer coupled to at least a portion of the barrier layer;
a thermally conductive layer coupled to at least a portion of the electrically conductive layer; and
a second bonding layer coupled to at least a portion of the thermally conductive layer.

20. The engineered substrate structure of claim 14 wherein the substantially single crystal layer comprises one of Si, $Ga_2O_3$, SiC, GaN, or sapphire.

* * * * *